(12) United States Patent
Roethig et al.

(10) Patent No.: US 11,514,993 B1
(45) Date of Patent: Nov. 29, 2022

(54) PROGRAMMABLE LINEAR-FEEDBACK SHIFT REGISTER SYSTEMS AND METHODS

(71) Applicant: Lattice Semiconductor Corporation, Hillsboro, OR (US)

(72) Inventors: Wolfgang Roethig, San Jose, CA (US); Ashutosh Dikshit, Saratoga, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 17/733,961

(22) Filed: Apr. 29, 2022

Related U.S. Application Data

(63) Continuation of application No. PCT/US2021/030357, filed on Apr. 30, 2021.

(51) Int. Cl.
*G11C 19/28* (2006.01)
*G11C 7/10* (2006.01)

(52) U.S. Cl.
CPC ............ *G11C 19/28* (2013.01); *G11C 7/1057* (2013.01); *G11C 7/1066* (2013.01); *G11C 7/1084* (2013.01); *G11C 7/1093* (2013.01)

(58) Field of Classification Search
CPC ...................................................... G11C 19/28
USPC ...................................................... 365/189.12
See application file for complete search history.

(56) References Cited

U.S. PATENT DOCUMENTS

| | | | |
|---|---|---|---|
| 9,317,253 B1 | 4/2016 | Payne | |
| 9,367,509 B2 | 6/2016 | Wortman et al. | |
| 10,009,198 B2 | 6/2018 | Wortman et al. | |
| 10,923,211 B1* | 2/2021 | Eisenhuth | ........... G06F 9/30029 |
| 2003/0014683 A1* | 1/2003 | Deas | ....................... H04L 25/14 |
| | | | 713/503 |
| 2007/0239812 A1 | 10/2007 | Lablans | |
| 2010/0161866 A1 | 6/2010 | Weber et al. | |
| 2014/0258721 A1 | 9/2014 | Avanzi et al. | |
| 2017/0206085 A1 | 7/2017 | Bradbury et al. | |

(Continued)

FOREIGN PATENT DOCUMENTS

KR     10-2015-0028345     3/2015

OTHER PUBLICATIONS

Mishra,Shivshankar et al.,"Implementation of Configurable Linear Feedback Shift Register in VHDL",2016,pp. 342-346.*

(Continued)

*Primary Examiner* — Muna A Techane
(74) *Attorney, Agent, or Firm* — Haynes and Boone, LLP

(57) ABSTRACT

Various techniques are provided to implement programmable linear-feedback shift register (LFSR) circuits. In one example, the LFSR circuit includes state storage elements. Each state storage element is configured to store a state signal. The LFSR circuit further includes programmable logic stage circuits each configured to selectively receive an input signal and a set of state signals, determine an output signal based at least on the set of state signals, and provide the output signal. Each programmable logic stage circuit is connected to at least one other programmable logic stage circuit. The LFSR circuit further includes pipeline elements. Each pipeline element is configured to selectively connect at least two programmable logic stage circuits. The LFSR circuit further includes sets of latency balance elements. Related systems and methods are provided.

26 Claims, 16 Drawing Sheets

(56) References Cited

U.S. PATENT DOCUMENTS

2017/0328951 A1    11/2017  Liew
2019/0122723 A1*  4/2019  Ito ..................... G11C 11/40611

OTHER PUBLICATIONS

Puga,Gerardol.et al.,"Linear-Feedback Shift Register Seed Determination for Memory-Constrained Embedded Systems",2017,4 pages,IEEE,Montevideo,Uruguay.*

* cited by examiner

US 11,514,993 B1

PROGRAMMABLE LINEAR-FEEDBACK SHIFT REGISTER SYSTEMS AND METHODS

CROSS REFERENCE TO RELATED APPLICATIONS

This patent application is a continuation of International Application No. PCT/US2021/030357, filed Apr. 30, 2021, which is claimed for the benefit of and incorporated herein by reference in its entirety.

TECHNICAL FIELD

The present invention relates generally to programmable logic devices and, more particularly, to programmable linear feedback shift register systems and methods.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, the user designs are synthesized and mapped into configurable resources, including by way of non-limiting example programmable logic gates, look-up tables (LUTs), embedded hardware, interconnections, and/or other types of resources, available in particular PLDs. Physical placement and routing for the synthesized and mapped user designs may then be determined to generate configuration data for the particular PLDs. The generated configuration data is loaded into configuration memory of the PLDs to implement the programmable logic gates, LUTs, embedded hardware, interconnections, and/or other types of configurable resources.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
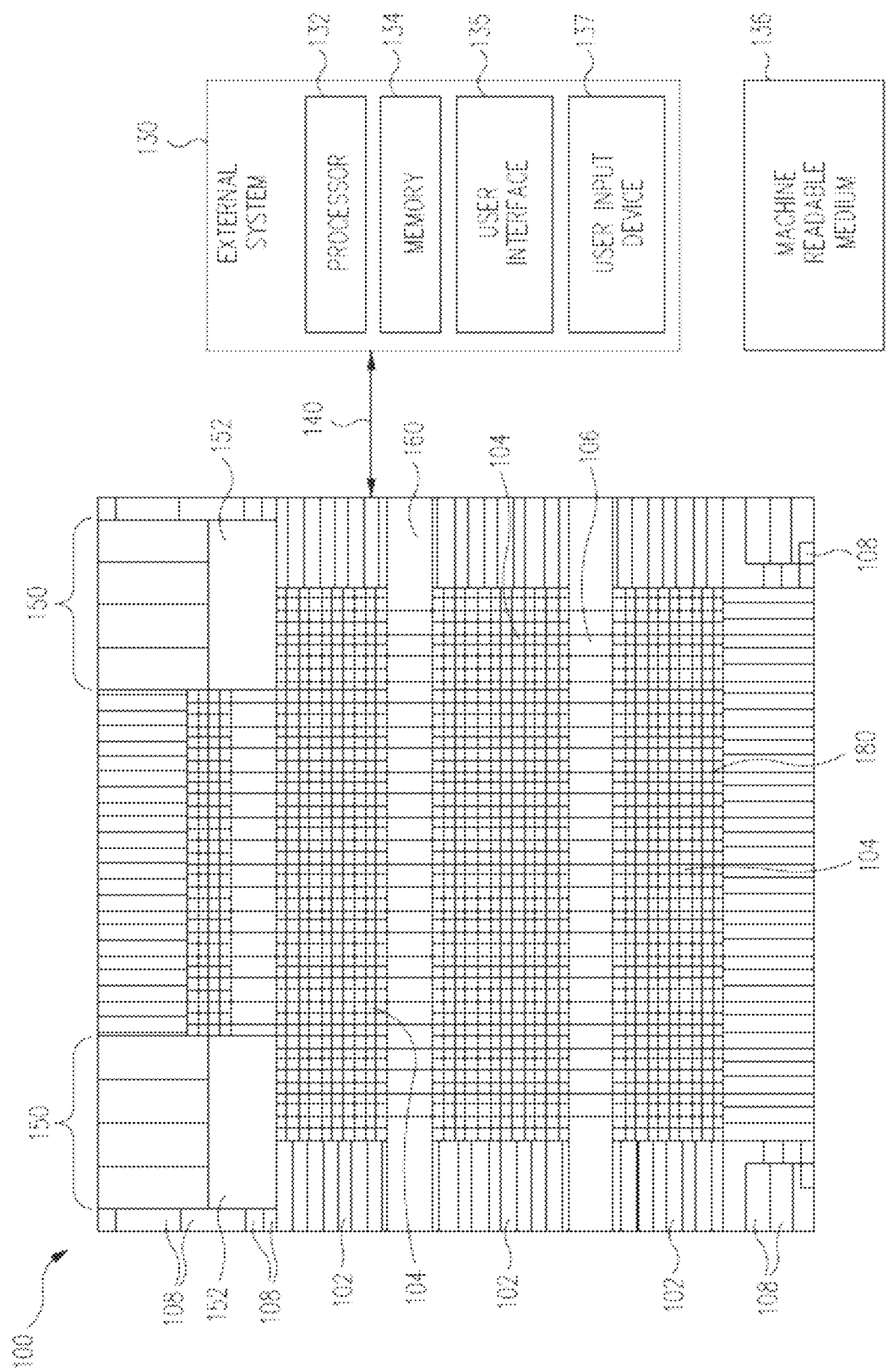
FIG. 1 illustrates a block diagram of a PLD in accordance with an embodiment of the disclosure.

In accordance with various embodiments set forth herein, techniques are provided to implement linear-feedback shift register (LFSR) circuitry within configurable/programmable logic components, such as components of a programmable logic device (PLD). For example, in some embodiments, a PLD includes a plurality of programmable logic blocks (PLBs), memory blocks, digital signal processing blocks, input/output blocks, and/or other components that may be interconnected in a variety of ways to implement a desired circuit design and/or functionality. A circuit design may be represented, at least in part, by a netlist, which can describe components and connections therebetween in the design. For example, a user design may be converted into and/or represented by a netlist including a set of PLD components (e.g., configured for logic, arithmetic, clocking, and/or other hardware functions) and associated interconnections available in a PLD. The netlist may be used to place components and/or route connections for the design (e.g., using routing resources of the PLD) with respect to a particular PLD (e.g., using a simulation of the desired circuit design constructed from the netlist). In general, a PLD (e.g., an FPGA) fabric includes various routing structures and an array of similarly arranged logic cells arranged within programmable function blocks (e.g., PFBs and/or PLBs). The goal in designing a particular type of PLD is generally to maximize functionality while minimizing area, power, and delay of the fabric.

While various embodiments are discussed herein with reference to and present improvements in the field of PLD utilization (e.g., including FPGA), various embodiments discussed herein may be implemented in other types of hardware and/or software. By way of non-limiting examples, LFSRs/LFSR architectures described herein may be implemented using application-specific integrated circuits (ASICs), system on chips, general logic circuits, processors (e.g., configurable processors, digital signal processors), generally any programmable resources of any programmable circuit or device, or any combination thereof. As an example, various embodiments may be used in custom built register transfer level (RTL) logic that can be implemented in a general integrated circuit (IC) and/or as its own type of dedicated block (e.g., as a standalone resource in a programmable fabric). Embodiments of the present design may allow for significant improvements in performance (e.g., timing performance) and space utilization, when implemented in a PLD, in RTL logic for a customized IC, and/or otherwise. As such, embodiments of the present disclosure should not be viewed as generally limited only to PLD implementations.

LFSR circuits may be used for a wide variety of applications, such as applications in communication systems. In some aspects, LFSR circuits may be used to facilitate high speed operation, such as in the gigahertz range. By way of non-limiting examples, LFSR circuits may be used for pseudorandom number generation/checking (e.g., pseudorandom binary sequence (PRBS) generation/checking), scrambling/descrambling, and error detection (e.g., checksum calculation for cyclic redundancy check (CRC), forward error correction (FEC), etc.).

An LFSR circuit may be characterized using an LFSR architecture/topology type, a generator polynomial (e.g., also referred to as a characteristic polynomial or a feedback polynomial), and/or a data entry polynomial. In an embodiment, an LFSR circuit may have a type 1 architecture or a type 2 architecture. In the type 1 architecture, combinatorial logic may be provided external to a path formed of state storage elements. In an aspect, the type 1 architecture may be referred to as an external logic LFSR architecture or a Fibonacci architecture. In the type 2 architecture, combinatorial logic may be provided in-line with a path formed of the state storage elements. In an aspect, the type 2 architecture may be referred to as an internal logic LFSR architecture or a Galois architecture.

In some embodiments, LFSR circuits include state storage elements (e.g., also referred to as registers), programmable multipliers, programmable combiners, and associated programmable routing resources for selectively connecting the state storage elements, programmable multipliers, and/or programmable combiners. In an aspect, such LFSR circuits may be referred to as programmable LFSR circuits (e.g., in contrast to fixed LFSR circuits). Each programmable multiplier, each programmable combiner, and associated programmable routing resources may be selectively programmed (e.g., selectively enabled or disabled) depending on a combinatorial logic (e.g., an application) to be implemented using the LFSR circuits. For a given LFSR circuit, each state storage element may be a memory cell to store (e.g., buffer) a state signal of the LFSR circuit. Each state signal may be a bit. In some cases, a current state of the LFSR circuit may be indicated by the state signals stored in the state storage elements of the LFSR circuit. As a non-limiting example, each state storage element may be implemented by a flip-flop (e.g., D-type flip-flop). In some cases, each combiner may implement a bitwise operation, such as an exclusive-or (XOR) operation or exclusive-nor (XNOR) operation.

In some embodiments, a programmable multi-mode LFSR circuit allows for LFSR architecture type, generator polynomial, and/or data entry polynomial to be programmable (e.g., on-the-fly) based on desired applications. Certain applications may be considered more amenable to being implemented using a type 1 architecture or a type 2 architecture (e.g., type 1 for PRBS and self-synchronizing scrambler, type 2 for CRC and FEC, etc.). In some aspects, alternative to or in addition to allowing the LFSR architecture type to be programmable, a programmable LFSR circuit with a type 1 LFSR architecture and a programmable output conversion logic circuit may be programmed and connected to each other such that the programmable output conversion logic circuit receives type 1 outputs from the LFSR circuit and convert the type 1 outputs to type 2 outputs. In some cases, such conversion may be performed rather than implementing a type 2 LFSR circuit to directly generate type 2 outputs since, in various cases, a type 1 LFSR circuit may be associated with lower chip area (e.g., smaller utilized standard cell area and/or fewer components) and/or better timing performance than a corresponding type 2 LFSR circuit. In this regard, in such cases, through such conversion, type 1 LFSR architecture may be implemented to leverage its usage of less area (e.g., fewer components) and better timing performance, while providing type 2 LFSR outputs if appropriate for a given application. Equivalence between various aspects of the type 1 LFSR architecture and the type 2 LFSR architecture is described, for example, with respect to FIGS. 14-19.

In some embodiments, the programmable LFSR circuit may allow for programming of parallel implementations in which multiple outputs may be provided by the LFSR circuit per time unit (e.g., clock cycle), thus facilitating higher data rates. As an example, in some cases, parallel programmable LFSR circuit architectures may allow for data rates in the tens or hundreds of gigabits per second as desired. As such, parallel implementations may facilitate meeting of a desired throughput. In some cases, in contrast to high speed serial architectures that generally require components capable of operating at higher clock rates, parallelization may allow high data rates while using standard cells, which are generally associated with lower clock rates.

In some aspects, to allow for timing closure for LFSR circuits having parallelization, pipeline stages may be provided. With the addition of the pipeline stages, latency balancing may be applied to inputs and/or outputs of the LFSR circuits such that inputs are received for processing and outputs are provided at a desired time unit (e.g., clock cycle). The pipeline stages may be considered to separate/split a sequential, combinatorial path of the LFSR circuits into sets of combinatorial stages. Each set of combinatorial stages may be associated with respective latency balancing circuitry. In some cases, such pipeline stages and latency balancing may be implemented using storage elements, such as flip-flops, to provide appropriate signal buffering.

In some aspects, a given LFSR circuit may be split into a feedforward logic portion having no feedback loops and a feedback logic portion. The feedforward logic portion may implement computation of outputs of the LFSR circuit. The feedback logic portion may implement matrix multiplication associated with transitions in a state of the LFSR circuit. The pipeline stages (and associated latency balancing) may be provided in the feedforward logic portion to allow for timing closure. Throughput reduction associated with the pipeline stages may be avoided by taking feedback logic out of the pipelined path.

In some embodiments, the programmable multi-mode LFSR circuit may be provided as a standalone resource in a programmable fabric. With such a resource, a subsystem that needs LFSR functionality can be built using specialized circuitry instead of general-purpose logic, such as to facilitate higher operating speed and less power consumption. Programmable LFSR circuits may be used in high-speed communications and selectively adjusted through its programmability to allow for higher performance and bandwidth as needed, such as to accommodate emerging standards and/or evolving customer requirements. Various embodiments may provide programmable LFSR circuits for application (e.g., real-time application) or emulation at higher speeds and allow operation operated at data rates as specified, for example, by 10G Ethernet, 25G Ethernet, and beyond.

Such multi-mode LFSR circuits may provide support for multiple existing and emerging standards, designs, and applications as desired. In one case, the programmable LFSR circuit may be advantageous for multi-protocol serializer/deserializer (SERDES). In this regard, the LFSR circuits may be utilized support various standards for serial data communication (e.g., SERDES) such as IEEE 802.3, PCIe, and JESD204C, which prescribe fixed LFSR circuits for specific applications. Such programmability/flexibility may allow for less rigid/more versatile LFSR specification in standards and/or extensions thereof for high-speed communication to be set forth. For example, users of a standard may develop more efficient error correction capability for a given communication channel, optimal spectral signal properties based on a particular scrambler, and so forth.

Referring now to the figures, FIG. 1 illustrates a block diagram of a PLD 100 in accordance with an embodiment of the disclosure. In various embodiments, the PLD 100 may be implemented as a standalone device, for example, or may be embedded within a system on a chip (SOC), other logic devices, and/or other integrated circuit(s). The PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). In some cases, the PLD 100 may generally be any type of programmable device (e.g., programmable integrated circuit) with distributed configuration, which may involve loading configuration data through pins, shifting to appropriate locations in associated fabric, and configuring configuration memory cells. The PLBs may also be referred to as logic blocks, programmable functional units (PFUs), or programmable logic cells (PLCs). In an aspect, the PLBs 104 may collectively form an integrated circuit (IC) core or logic core of the PLD 100. The I/O blocks 102 provide I/O functionality (e.g., to support one or more I/O and/or memory interface standards) for the PLD 100, while the PLBs 104 provide logic functionality (e.g., LUT-based logic) for the PLD 100. Additional I/O functionality may be provided by serializer/deserializer (SERDES) blocks 150 and physical coding sublayer (PCS) blocks 152. The PLD 100 may also include hard intellectual property core (IP) blocks 160 to provide additional functionality (e.g., substantially predetermined functionality provided in hardware which may be configured with less programming than the PLBs 104).

The PLD 100 may include blocks of memory 106 (e.g., blocks of erasable programmable read-only memory (EEPROM), block static RAM (SRAM), and/or flash memory), clock-related circuitry 108 (e.g., clock sources, phase-locked loop (PLL) circuits, delay-locked loop (DLL) circuits, and/or feedline interconnects), and/or various routing resources 180 (e.g., interconnect and appropriate switching circuits to provide paths for routing signals throughout the PLD 100, such as for clock signals, data signals, control signals, or others) as appropriate. In general, the various elements of the PLD 100 may be used to perform their intended functions for desired applications, as would be understood by one skilled in the art.

For example, certain of the I/O blocks 102 may be used for programming the memory 106 or transferring information (e.g., various types of user data and/or control signals) to/from the PLD 100. Other of the I/O blocks 102 include a first programming port (which may represent a central processing unit (CPU) port, a peripheral data port, a serial peripheral interface (SPI) interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various embodiments, the I/O blocks 102 may be included to receive configuration data and commands (e.g., over one or more connections) to configure the PLD 100 for its intended use and to support serial or parallel device configuration and information transfer with the SERDES blocks 150, PCS blocks 152, hard IP blocks 160, and/or PLBs 104 as appropriate. In another example, the routing resources 180 may be used to route connections between components, such as between I/O nodes of logic blocks 104. In some embodiments, such routing resources may include programmable elements (e.g., nodes where multiple routing resources intersect) that may be used to selectively form a signal path for a particular connection between components of the PLD 100.

It should be understood that the number and placement of the various elements are not limiting and may depend upon the desired application. For example, various elements may not be required for a desired application or design specification (e.g., for the type of programmable device selected). Furthermore, it should be understood that the elements are illustrated in block form for clarity and that various elements would typically be distributed throughout the PLD 100, such as in and between the PLBs 104, hard IP blocks 160, and routing resources 180 to perform their conventional functions (e.g., storing configuration data that configures the PLD 100 or providing interconnect structure within the PLD 100). For example, the routing resources 180 may be used for internal connections within each PLB 104 and/or between different PLBs 104. It should also be understood that the various embodiments disclosed herein are not limited to programmable logic devices, such as the PLD 100, and may be applied to various other types of programmable devices, as would be understood by one skilled in the art.

An external system 130 may be used to create a desired user configuration or design of the PLD 100 and generate corresponding configuration data to program (e.g., configure) the PLD 100. For example, to configure the PLD 100, the system 130 may provide such configuration data to one or more of the I/O blocks 102, PLBs 104, SERDES blocks 150, and/or other portions of the PLD 100. In this regard, the external system 130 may include a link 140 that connects to a programming port (e.g., SPI, JTAG) of the PLD 100 to facilitate transfer of the configuration data from the external system 130 to the PLD 100. As a result, the I/O blocks 102, PLBs 104, various of the routing resources 180, and any other appropriate components of the PLD 100 may be configured to operate in accordance with user-specified applications.

In the illustrated embodiment, the system 130 is implemented as a computer system. In this regard, the system 130 includes, for example, one or more processors 132 that may be configured to execute instructions, such as software instructions, provided in one or more memories 134 and/or stored in non-transitory form in one or more non-transitory machine readable media 136 (e.g., which may be internal or external to the system 130). For example, in some embodiments, the system 130 may run PLD configuration software, such as Lattice Diamond System Planner software available from Lattice Semiconductor Corporation to permit a user to create a desired configuration and generate corresponding configuration data to program the PLD 100. In this regard, in some cases, the system 130 and/or other external/remote system may be used for factory programming or remote programming (e.g., remote updating) of one or more PLDs (e.g., through a network), such as the PLD 100.

The configuration data may alternatively or in addition be stored on the PLD 100 (e.g., stored in a memory located within the PLD 100) and/or a separate/discrete memory of a system including the PLD 100 and the separate/discrete memory (e.g., a system within which the PLD 100 is operating). In some embodiments, the memory 106 of the PLD 100 may include non-volatile memory (e.g., flash memory) utilized to store the configuration data generated and provided to the memory 106 by the external system 130. During configuration of the PLD 100, the non-volatile memory may provide the configuration data via configuration paths and associated data lines to configure the various portions (e.g., I/O blocks 102, PLBs 104, SERDES blocks 150, routing resources 180, and/or other portions) of the PLD 100. In some cases, the configuration data may be stored in non-volatile memory external to the PLD 100 (e.g., on an external hard drive such as the memories 134 in the system 130). During configuration, the configuration data may be provided (e.g., loaded) from the external non-volatile memory into the PLD 100 to configure the PLD 100.

The system 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of the PLD 100. In some embodiments, user interface 135 may be adapted to display a netlist, a component placement, a connection routing, hardware description language (HDL) code, and/or other final and/or intermediary representations of a desired circuit design, for example.

Figure 2:
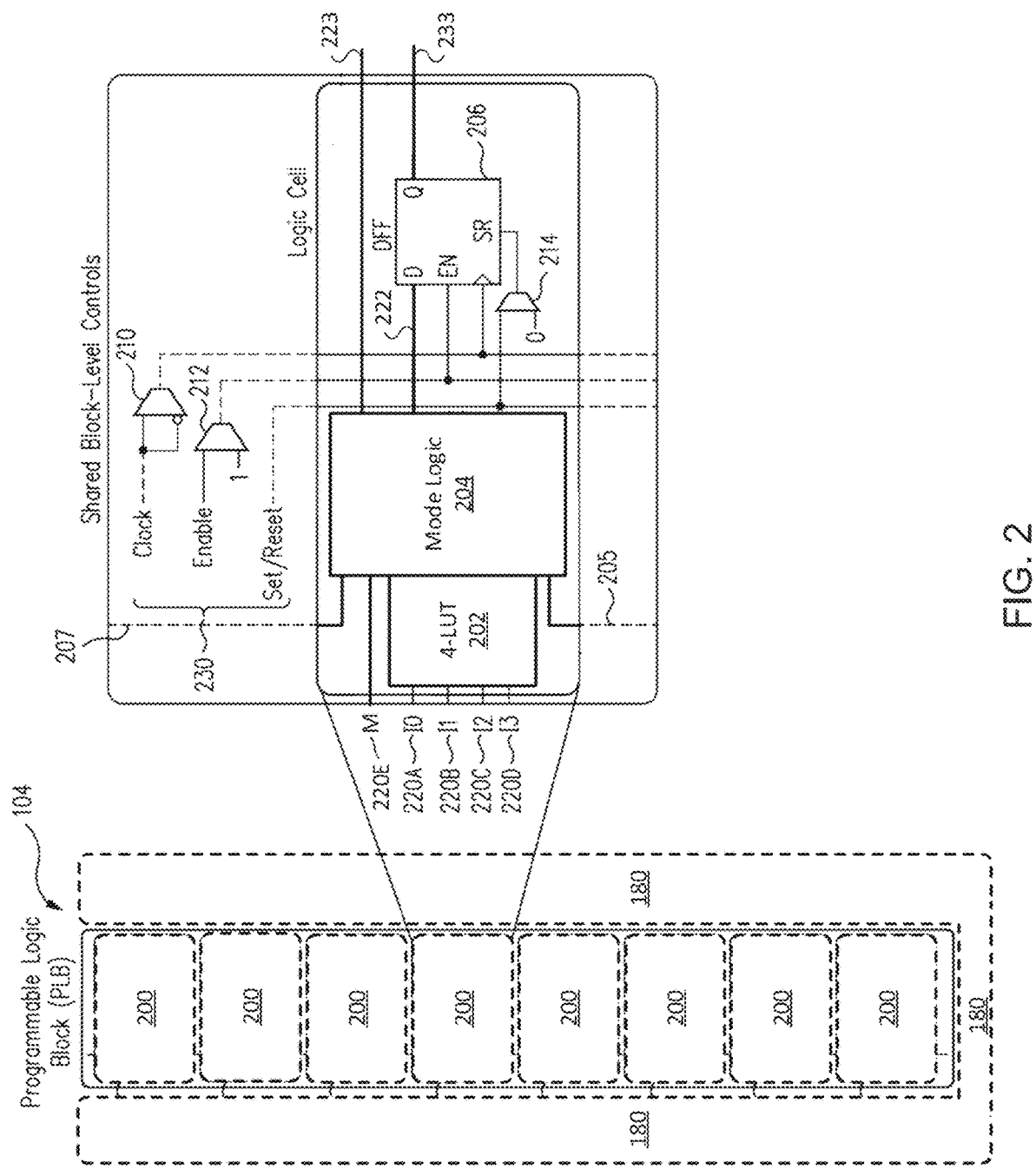
FIG. 2 illustrates a block diagram of a logic block of a PLD in accordance with an embodiment of the disclosure.

FIG. 2 illustrates a block diagram of a logic block 104 of the PLD 100 in accordance with an embodiment of the disclosure. As discussed, the PLD 100 includes a plurality of logic blocks 104 including various components to provide logic and arithmetic functionality. In the example embodiment shown in FIG. 2, the logic block 104 includes a plurality of logic cells 200, which may be interconnected internally within logic block 104 and/or externally using the routing resources 180. For example, each logic cell 200 may include various components such as: a lookup table (LUT) 202, a mode logic circuit 204, a register 206 (e.g., a flip-flop or latch), and various programmable multiplexers (e.g., programmable multiplexers 212 and 214) for selecting desired signal paths for the logic cell 200 and/or between logic cells 200. In this example, the LUT 202 accepts four inputs 220A-220D, which makes it a four-input LUT (which may be abbreviated as "4-LUT" or "LUT4") that can be programmed by configuration data for the PLD 100 to implement any appropriate logic operation having four inputs or less. The mode logic 204 may include various logic elements and/or additional inputs, such as an input 220E, to support the functionality of various modes for the logic cell 200 (e.g., including various processing and/or functionality modes). The LUT 202 in other examples may be of any other suitable size having any other suitable number of inputs for a particular implementation of a PLD. In some embodiments, different size LUTs may be provided for different logic blocks 104 and/or different logic cells 200.

An output signal 222 from the LUT 202 and/or the mode logic 204 may in some embodiments be passed through the register 206 to provide an output signal 233 of the logic cell 200. In various embodiments, an output signal 223 from the LUT 202 and/or the mode logic 204 may be passed to the output 223 directly, as shown. Depending on the configuration of multiplexers 210-214 and/or the mode logic 204, the output signal 222 may be temporarily stored (e.g., latched) in the register 206 according to control signals 230. In some embodiments, configuration data for the PLD 100 may configure the output 223 and/or 233 of the logic cell 200 to be provided as one or more inputs of another logic cell 200 (e.g., in another logic block or the same logic block) in a staged or cascaded arrangement (e.g., comprising multiple levels) to configure logic and/or other operations that cannot be implemented in a single logic cell 200 (e.g., operations that have too many inputs to be implemented by a single LUT 202). Moreover, logic cells 200 may be implemented with multiple outputs and/or interconnections to facilitate selectable modes of operation.

The mode logic circuit 204 may be utilized for some configurations of the PLD 100 to efficiently implement arithmetic operations such as adders, subtractors, comparators, counters, or other operations, to efficiently form some extended logic operations (e.g., higher order LUTs, working on multiple bit data), to efficiently implement a relatively small RAM, and/or to allow for selection between logic, arithmetic, extended logic, and/or other selectable modes of operation. In this regard, the mode logic circuits 204, across multiple logic cells 202, may be chained together to pass carry-in signals 205 and carry-out signals 207, and/or other signals (e.g., output signals 222) between adjacent logic cells 202. In the example of FIG. 2, the carry-in signal 205 may be passed directly to the mode logic circuit 204, for example, or may be passed to the mode logic circuit 204 by configuring one or more programmable multiplexers. In some cases, the mode logic circuits 204 may be chained across multiple logic blocks 104.

The logic cell 200 illustrated in FIG. 2 is merely an example, and logic cells 200 according to different embodiments may include different combinations and arrangements of PLD components. Also, although FIG. 2 illustrates a logic block 104 having eight logic cells 200, a logic block 104 according to other embodiments may include fewer logic cells 200 or more logic cells 200. Each of the logic cells 200 of a logic block 104 may be used to implement a portion of a user design implemented by the PLD 100. In this regard, the PLD 100 may include many logic blocks 104, each of which may include logic cells 200 and/or other components which are used to collectively implement the user design.

Figure 3:
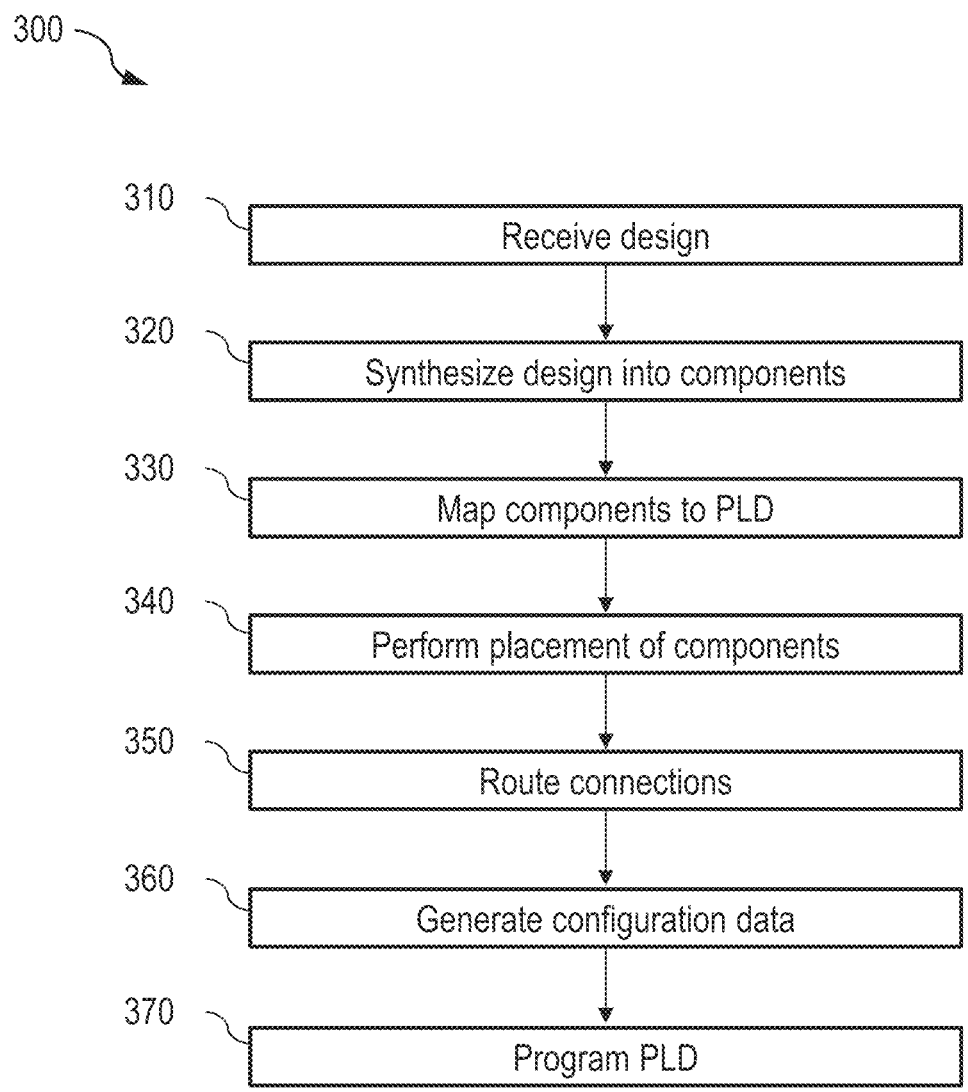
FIG. 3 illustrates a design process for a PLD in accordance with an embodiment of the disclosure.

FIG. 3 illustrates a design process 300 for a PLD in accordance with an embodiment of the disclosure. For example, the process of FIG. 3 may be performed by system 130 running Lattice Diamond software to configure the PLD 100. In some embodiments, the various files and information referenced in FIG. 3 may be stored, for example, in one or more databases and/or other data structures in the memory 134, the machine readable medium 136, and/or other storage.

In operation 310, the system 130 receives a user design that specifies the desired functionality of the PLD 100. For example, the user may interact with the system 130 (e.g., through the user input device 137 and hardware description language (HDL) code representing the design) to identify various features of the user design (e.g., high level logic operations, hardware configurations, I/O and/or SERDES operations, and/or other features). In some embodiments, the user design may be provided in a RTL description (e.g., a gate level description). The system 130 may perform one or more rule checks to confirm that the user design describes a valid configuration of PLD 100. For example, the system 130 may reject invalid configurations and/or request the user to provide new design information as appropriate.

In operation 320, the system 130 synthesizes the design to create a netlist (e.g., a synthesized RTL description) identifying an abstract logic implementation of the user design as a plurality of logic components (e.g., also referred to as netlist components). In some embodiments, the netlist may be stored in Electronic Design Interchange Format (EDIF) in a Native Generic Database (NGD) file.

In some embodiments, synthesizing the design into a netlist in operation 320 may involve converting (e.g., translating) the high-level description of logic operations, hardware configurations, and/or other features in the user design into a set of PLD components (e.g., logic blocks 104, logic cells 200, and other components of the PLD 100 configured for logic, arithmetic, or other hardware functions to implement the user design) and their associated interconnections or signals. Depending on embodiments, the converted user design may be represented as a netlist.

In some embodiments, synthesizing the design into a netlist in operation 320 may further involve performing an optimization process on the user design (e.g., the user design converted/translated into a set of PLD components and their associated interconnections or signals) to reduce propagation delays, consumption of PLD resources and routing resources, and/or otherwise optimize the performance of the PLD when configured to implement the user design. In some cases, combinatorial logic associated with LFSR circuitry may be optimized to reduce a number of components (e.g., multipliers, combiners), remove redundant components/computations, and so forth. During the optimization process, combinatorial paths of the LFSR circuitry may be traversed at a desired clock speed. Depending on embodiments, the optimization process may be performed on a netlist representing the converted/translated user design. Depending on embodiments, the optimization process may represent the optimized user design in a netlist (e.g., to produce an optimized netlist).

In some embodiments, the optimization process may include optimizing routing connections identified in a user design. For example, the optimization process may include detecting connections with timing errors in the user design, and interchanging and/or adjusting PLD resources implementing the invalid connections and/or other connections to reduce the number of PLD components and/or routing resources used to implement the connections and/or to reduce the propagation delay associated with the connections. In some cases, wiring distances may be determined based on timing.

In operation 330, the system 130 performs a mapping process that identifies components of the PLD 100 that may be used to implement the user design. In this regard, the system 130 may map the optimized netlist (e.g., stored in operation 320 as a result of the optimization process) to various types of components provided by the PLD 100 (e.g., logic blocks 104, logic cells 200, embedded hardware, and/or other portions of the PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in operation 320 to produce a netlist that is mapped to PLD components.

In operation 340, the system 130 performs a placement process to assign the mapped netlist components to particular physical components residing at specific physical locations of the PLD 100 (e.g., assigned to particular logic cells 200, logic blocks 104, clock-related circuitry 108, routing resources 180, and/or other physical components of PLD 100), and thus determine a layout for the PLD 100. In some embodiments, the placement may be performed in memory on data retrieved from one or more previously-stored NCD files, for example, and/or on one or more previously-stored NCD files, with the placement results stored (e.g., in the memory 134 and/or the machine readable medium 136) as another physical design file.

In operation 350, the system 130 performs a routing process to route connections (e.g., using the routing resources 180) among the components of the PLD 100 based on the placement layout determined in operation 340 to realize the physical interconnections among the placed components. In some embodiments, the routing may be performed in memory on data retrieved from one or more previously-stored NCD files, for example, and/or on one or more previously-stored NCD files, with the routing results stored (e.g., in the memory 134 and/or the machine readable medium 136) as another physical design file.

In various embodiments, routing the connections in operation 350 may further involve performing an optimization process on the user design to reduce propagation delays, consumption of PLD resources and/or routing resources, and/or otherwise optimize the performance of the PLD when configured to implement the user design. The optimization process may in some embodiments be performed on a physical design file representing the converted/translated user design, and the optimization process may represent the optimized user design in the physical design file (e.g., to produce an optimized physical design file).

Changes in the routing may be propagated back to prior operations, such as synthesis, mapping, and/or placement, to further optimize various aspects of the user design.

Thus, following operation 350, one or more physical design files may be provided which specify the user design after it has been synthesized (e.g., converted and optimized), mapped, placed, and routed (e.g., further optimized) for the PLD 100 (e.g., by combining the results of the corresponding previous operations). In operation 360, the system 130 generates configuration data for the synthesized, mapped, placed, and routed user design. In operation 370, the system 130 configures/programs the PLD 100 with the configuration data by, for example, loading a configuration data bitstream into the PLD 100 over the connection 140.

Figure 4:
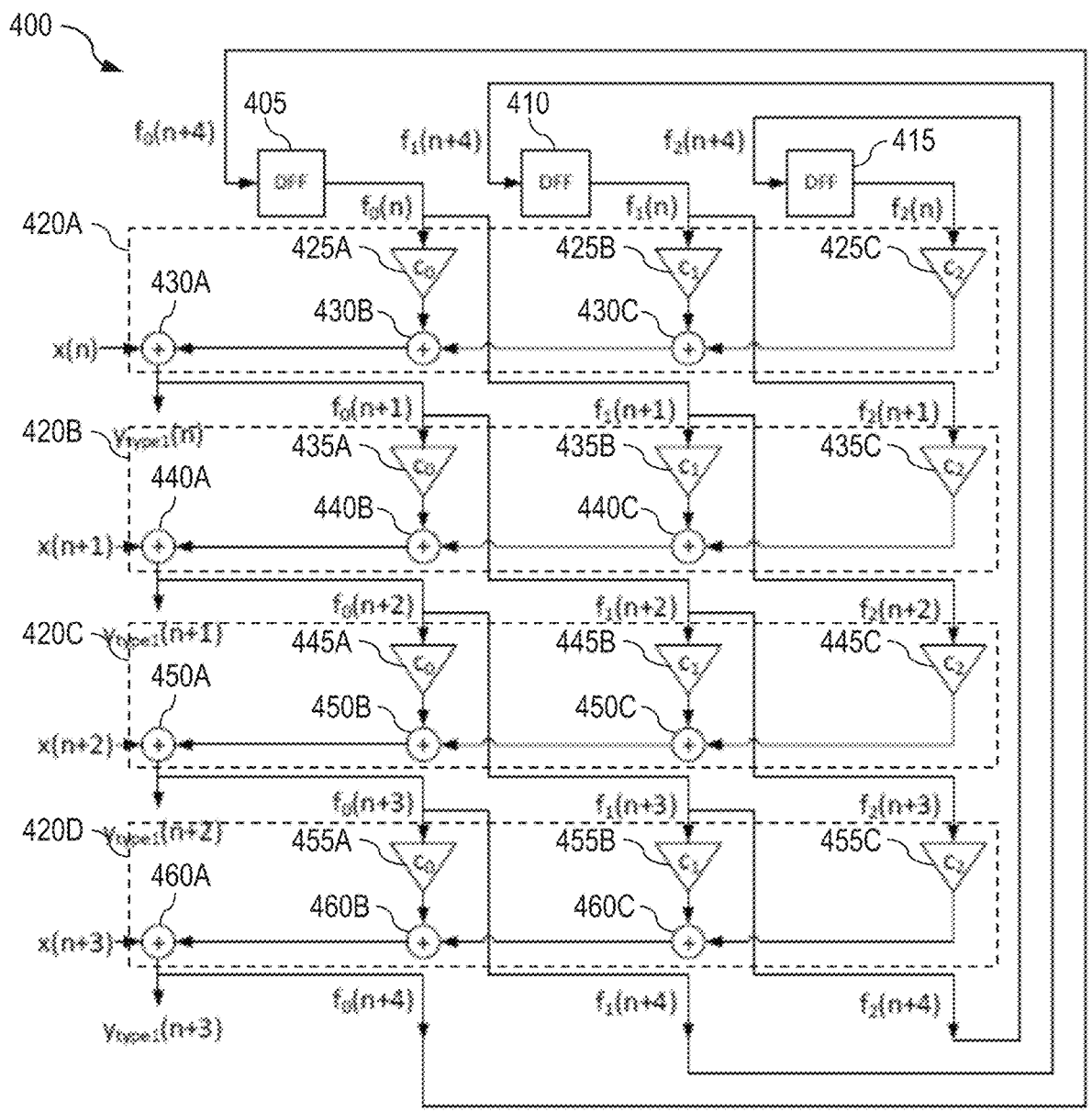
FIG. 4 illustrates a block diagram of a linear-feedback shift register circuit having a type 1 topology in accordance with an embodiment of the disclosure.

FIG. 4 illustrates a block diagram of an LFSR circuit 400 in accordance with an embodiment of the disclosure. In an embodiment, the LFSR circuit 400 provides a parallel implementation of a serial LFSR circuit, such as an example three-tap serial LFSR circuit described with respect to FIG. 14. Such a parallel implementation may be obtained by unrolling and replicating logic of a serial LFSR representation. In this regard, the LFSR circuit 400 provides a parallel 4-bit LFSR circuit that provides four output signals $y_{type1}(n)$, $y_{type1}(n+1)$, $y_{type1}(n+2)$, and $y_{type1}(n+3)$ for each time unit (e.g., each clock cycle). Such output signals may be referred to as primary outputs of the LFSR circuit 400. The output signals may be provided to a downstream system or subsystem dependent on application. For example, if the LFSR circuit 400 is programmed to implement a pseudorandom sequence generator, each of the output signals may be a bit of a pseudorandom sequence and provided (e.g., transmitted) to a security-related key generator that generates a key based on the pseudorandom sequence.

The LFSR circuit 400 includes state storage elements 405, 410, and 415 and programmable logic stage circuits 420A-D (e.g., also referred to as programmable combinatorial logic stage circuits). Each state storage element may be a memory cell to store (e.g., buffer) a state signal of the LFSR circuit 400. As a non-limiting example, each state storage element may be implemented by a flip-flop (e.g., D-type flip-flop). The programmable logic stage circuit 420A includes programmable multipliers 425A-C (also referred to simply as multipliers) and programmable combiners 430A-C (also referred to simply as combiners). In an aspect, a programmable multiplier may be referred to as a programmable tap. The programmable logic stage circuit 420B includes programmable multipliers 435A-C and programmable combiners 440A-C. The programmable logic stage circuit 420C includes programmable multipliers 445A-C and programmable combiners 450A-C. The programmable logic stage circuit 420D includes programmable multipliers 455A-C and programmable combiners 460A-C. The combiners 430A-C, 440A-C, 450A-C, and 460A-C may be collectively referred to as a combiner circuit of the programmable logic stage circuits 420A, 420B, 420C, and 420D, respectively. In some cases, each combiner may implement a bitwise operation, such as an XOR operation or XNOR operation.

Each programmable multiplier, each programmable combiner, and associated programmable routing between the programmable multipliers, the programmable combiners, and the storage elements 405, 410, and 415 may be selectively programmed (e.g., selectively enabled or disabled) depending on an application to be implemented by the LFSR 400 circuit. In some cases, the application to be implemented by the LFSR circuit 400 may be characterized by a generator polynomial. The multipliers 425A, 435A, 445A, and 455A may be enabled by setting a coefficient $c_0$ to a non-zero value and disabled by setting the coefficient $c_0$ to zero. The multipliers 425B, 435B, 445B, and 455B may be enabled by setting a coefficient $c_1$ to a non-zero value and disabled by setting the coefficient $c_1$ to zero. The multipliers 425C, 435C, 445C, and 455C may be enabled by setting a coefficient $c_2$ to a non-zero value and disabled by setting the coefficient $c_2$ to zero. In an aspect, the coefficients $c_0$, $c_1$, and $c_2$ may be binary coefficients having a value of 1 to enable or 0 to disable. Programmable routing resources may also be enabled or disabled based on the values of the corresponding coefficients $c_0$, $c_1$, and $c_2$.

As one example, if the coefficient $c_1$ is zero and the coefficients $c_0$ and $c_2$ are non-zero, programmable routing resources from the storage element 405 to the multiplier 435B, from the multiplier 435B to the combiner 440C, from the storage element 410 to multiplier 425B, from the multiplier 425B to the combiner 430C, from the combiner 430A to the multiplier 445B, from the multiplier 445B to the combiner 450C, and so forth may be disabled. In this example, the multipliers 425C, 435C, 445C, and 455C may be directly routed to the combiners 430B, 440B, 450B, and 460B, respectively, since the combiners 430C, 440C, 450C, and 460C, respectively, are disabled. Other programmable routing resources may be appropriately enabled or disabled based on the coefficient $c_1$ being zero and the coefficients $c_0$ and $c_2$ being non-zero.

Each of the state storage element 405, 410, and 415 has an input terminal and an output terminal. The output terminal of the state storage element 405 is selectively connected the programmable logic gate circuits 420A (e.g., via the multiplier 425A), 420B (e.g., via the multiplier 425B), and 420C (e.g., via the multiplier 425C). The output terminal of the storage element 410 is selectively connected to the programmable logic gate circuits 420A (e.g., at the multiplier 425B) and 420B (e.g., at the multiplier 435C). The output terminal of the state storage element 415 is selectively connected to the programmable logic gate circuit 420A (e.g., at the multiplier 425C). The input terminal of the storage element 405 is selectively connected to the programmable logic gate circuit 420D (e.g., at the combiner 460A). The input terminal of the storage element 410 is selectively connected to the programmable logic gate circuit 420C (e.g., at the combiner 450A). The input terminal of the storage element 415 is selectively connected to the programmable logic gate circuit 420B (e.g., via the combiner 440A). In this regard, feedback paths/loops of the parallel LFSR 400 may be selectively programmed such that the input terminal of the storage elements 405, 410, and 415 selectively receives feedback signals from the programmable logic gate circuits 420B, 420C, and 420D. The state storage elements 405, 410, and 415 receive state signals $f_0(n+4)$, $f_1(n+4)$, and $f_2(n+4)$, respectively, via respective feedback paths.

For the programmable logic gate circuit 420A, the multipliers 425A, 425B, and 425C are selectively connected to the state storage elements 405, 410, and 415, respectively. The multiplier 425A is selectively connected to the combiner 430B. Each of the multiplier 425B and the multiplier 425C is selectively connected to the combiner 430C. The combiner 430B is selectively connected to the combiner 430A. The combiner 430A is selectively connected to the programmable input terminal of the programmable logic gate circuit 420A to selectively receive the input signal x(n). It is noted that for some applications (e.g., such as when the LFSR circuit 400 is used to implement a pseudorandom bit sequence) the input signal x(n) may be optional or may not be present. The multipliers 425A, 425B, and 425C selectively receive state signals $f_0(n)$, $f_1(n)$, and $f_2(n)$. The combiner 430C selectively receives as inputs $c_2 f_2(n)$ and $c_1 f_1(n)$ and generates/provides an output based on these inputs. The combiner 430B selectively receives as inputs $c_0 f_0(n)$ and the output of the combiner 430C and generates/provides an output based on these inputs. The combiner 430A generates and provides the output signal $y_{type1}(n)$ based on the input signal x(n) and the output of the combiner 430B.

For the programmable logic gate circuit 420B, the multiplier 435A is selectively connected to the combiner 430A of the programmable logic stage circuit 420A, the multiplier 435B is selectively connected to the state storage element 405, and the multiplier 435C is selectively connected to the state storage element 410. The multiplier 435A is selectively connected to the combiner 440B. Each of the multiplier 435B and the multiplier 435C is selectively connected to the combiner 440C. The combiner 440C is selectively connected to the combiner 440B. The combiner 440B is selectively connected to the combiner 440A. The combiner 440A is selectively connected to the programmable input terminal of the programmable logic gate circuit 420B to selectively receive the input signal x(n+1). The multipliers 435A, 435B, and 435C selectively receive state signals $f_0(n+1)$, $f_1(n+1)$, and $f_2(n+1)$. The combiner 440C selectively receives as inputs $c_2 f_2(n+1)$ and $c_1 f_1(n+1)$ and generates/provides an output based on these inputs. The combiner 440B selectively receives as inputs $c_0 f_0(n+1)$ and the output of the combiner 440C and generates/provides an output based on these inputs. The combiner 440A generates and provides the output signal $y_{type1}(n+1)$ based on the input signal x(n+1) and the output of the combiner 440B.

For the programmable logic gate circuit 420C, the multiplier 445A is selectively connected to the combiner 440A of the programmable logic stage circuit 420B, the multiplier 445B is selectively connected to the combiner 430A of the programmable logic stage circuit 420A, and the multiplier 445C is selectively connected to the state storage element 405. The multiplier 445A is selectively connected to the combiner 450B. Each of the multiplier 445B and the multiplier 445C is selectively connected to the combiner 450C. The combiner 450C is selectively connected to the combiner 450B. The combiner 450B is selectively connected to the combiner 450A. The combiner 450A is selectively connected to the programmable input terminal of the programmable logic gate circuit 420C to selectively receive the input signal x(n+2). The multipliers 445A, 445B, and 445C selectively receive state signals $f_0(n+2)$, $f_1(n+2)$, and $f_2(n+2)$. The combiner 450C selectively receives as inputs $c_2 f_2(n+2)$ and $c_1 f_1(n+2)$ and generates/provides an output based on these inputs. The combiner 450B selectively receives as inputs $c_0 f_0(n+2)$ and the output of the combiner 450C and generates/provides an output based on these inputs. The combiner 450A generates and provides the output signal $y_{type1}(n+2)$ based on the input signal x(n+2) and the output of the combiner 450B.

For the programmable logic gate circuit 420D, the multiplier 455A is selectively connected to the combiner 450A of the programmable logic stage circuit 420C, the multiplier 455B is selectively connected to the combiner 440A of the programmable logic stage circuit 420B, and the multiplier 455C is selectively connected to the combiner 430A of the programmable logic stage circuit 420A. The multiplier 455A is selectively connected to the combiner 460B. Each of the multiplier 455B and the multiplier 455C is selectively connected to the combiner 460C. The combiner 460B is selectively connected to the combiner 460A. The combiner 460A is selectively connected to the programmable input terminal of the programmable logic gate circuit 420D to selectively receive the input signal x(n+3). The multipliers 455A, 455B, and 455C selectively receive state signals $f_0(n+3)$, $f_1(n+3)$, and $f_2(n+3)$. The combiner 460C selectively receives as inputs $c_2 f_2(n+3)$ and $c_1 f_1(n+3)$ and generates/provides an output based on these inputs. The combiner 460B selectively receives as inputs $c_0 f_0(n+3)$ and the output of the combiner 460C and generates/provides an output based on these inputs. The combiner 460A generates and provides the output signal $y_{type1}(n+3)$ based on the input signal x(n+3) and the output of the combiner 460B.

A state vector (e.g., also referred to as a current-state vector) associated with an $i^{th}$ programmable logic gate circuit (for $0 \le i \le 3$) with the programmable logic gate circuit 420A designated as a zeroth programmable logic gate circuit, the programmable logic gate circuit 420B designated as a first programmable logic gate circuit, and so forth, may be provided as:

$$\begin{bmatrix} f_0(n+i) \\ f_1(n+i) \\ f_2(n+i) \end{bmatrix}$$

which may also be denoted as $[f_0(n+i)\ f_1(n+i)\ f_2(n+i)]^T = [f_0\ f_1\ f_2]^T(n+i)$.

A next-state vector associated with the $i^{th}$ programmable logic gate circuit may be provided as:

$$\begin{bmatrix} f_0 \\ f_1 \\ f_2 \end{bmatrix}(n+i+1) = \begin{bmatrix} c_0 & c_1 & c_2 \\ 1 & 0 & 0 \\ 0 & 1 & 0 \end{bmatrix} \begin{bmatrix} f_0 \\ f_1 \\ f_2 \end{bmatrix}(n+i) + \begin{bmatrix} 1 \\ 0 \\ 0 \end{bmatrix} x(n+i)$$

where $$\begin{bmatrix} 1 \\ 0 \\ 0 \end{bmatrix} x(n+i)$$

is an input vector and $$\begin{bmatrix} c_0 & c_1 & c_2 \\ 1 & 0 & 0 \\ 0 & 1 & 0 \end{bmatrix}$$

is a next-state matrix (e.g., also referred to as a state transition matrix).

An output equation (e.g., also referred to as a primary output equation) associated with the programmable logic gate circuit 420A provided by:

$$y_{type1}(n+i) = f_0(n+i+1) = \begin{bmatrix} c_0 & c_1 & c_2 \end{bmatrix} \begin{bmatrix} f_0 \\ f_1 \\ f_2 \end{bmatrix}(n+i) + \begin{bmatrix} 1 \\ 0 \\ 0 \end{bmatrix} x(n+i)$$

In this regard, the LFSR circuit 400 may be characterized by its next-state vector (e.g., system of next-state equations) and its output equation. The next-state vector and the output equation describe the state and the primary output of the LFSR circuit 400 after an operation (e.g., a bit-shift operation) as a function of the current-state vector, the input vector, and the next-state matrix. The next-state matrix has only one non-trivial row representing the generator polynomial of the LFSR circuit 400. Other positions of the state transition matrix are populated by ones across the diagonal and zeroes elsewhere. In other words, the state transition matrix is a sparse matrix.

The LFSR circuit 400, which provides a parallel implementation equivalent to four bit-shift operations, includes appropriate hardware (e.g., multipliers, combiners, and associated routing) to multiple the state transition matrix with itself four times. A resulting matrix from multiplication of the state transition matrix (e.g., sparse state transition matrix) with itself multiple times generally becomes populated and is no longer sparse. Through the parallel implementation, rather than programming 4×4 coefficients of the matrix resulting from multiplying the state transition matrix with itself four times (e.g., for a serial LFSR circuit implementation), the LFSR circuit 400 implements the matrix multiplication by programming just the generator polynomial with four coefficients, thus reducing programming complexity (e.g., relative to the case of the serial LFSR circuit). More generally, for a parallel implementation equivalent to N bit-shift operations, the next-state matrix is multiplied with itself N times. Through the parallel implementation, rather than programming N×N coefficients of the matrix resulting from multiplying the state transition matrix with itself N times, a parallel LFSR architecture may implement the matrix multiplication through programming just the generator polynomial with N coefficients, thus reducing programming complexity.

It is noted that FIG. 4 (and subsequent figures) illustrates one non-limiting example of programmable routing resources used for selectively connecting the various components (e.g., state storage elements, multipliers, combiners). In this regard, various arrows represent programmable routing resources along with associated direction of data flow (e.g., flow of one bit of data). As an example, while in FIG. 4 the combiner 440A is shown as selectively connecting to the multipliers 445A and 455B via programming routing resources that overlap in part, the overlap in the programming routing resources may be different from that shown in FIG. 4 or the programmable routing resources for selectively routing the combiner 440A to the multiplier 445A is non-overlapping with (e.g., completely separate from) the programmable routing resources for selectively routing the combiner 440A to the multiplier 455B. Further, although the LFSR circuit 400 of FIG. 4 illustrates a four-bit case, LFSR circuits associated with more or fewer than four bits may be implemented. For example, the LFSR circuit 400 may be a part of a larger programmable fabric that has been specifically programmed to implement the LFSR circuit 400.

Figure 5:
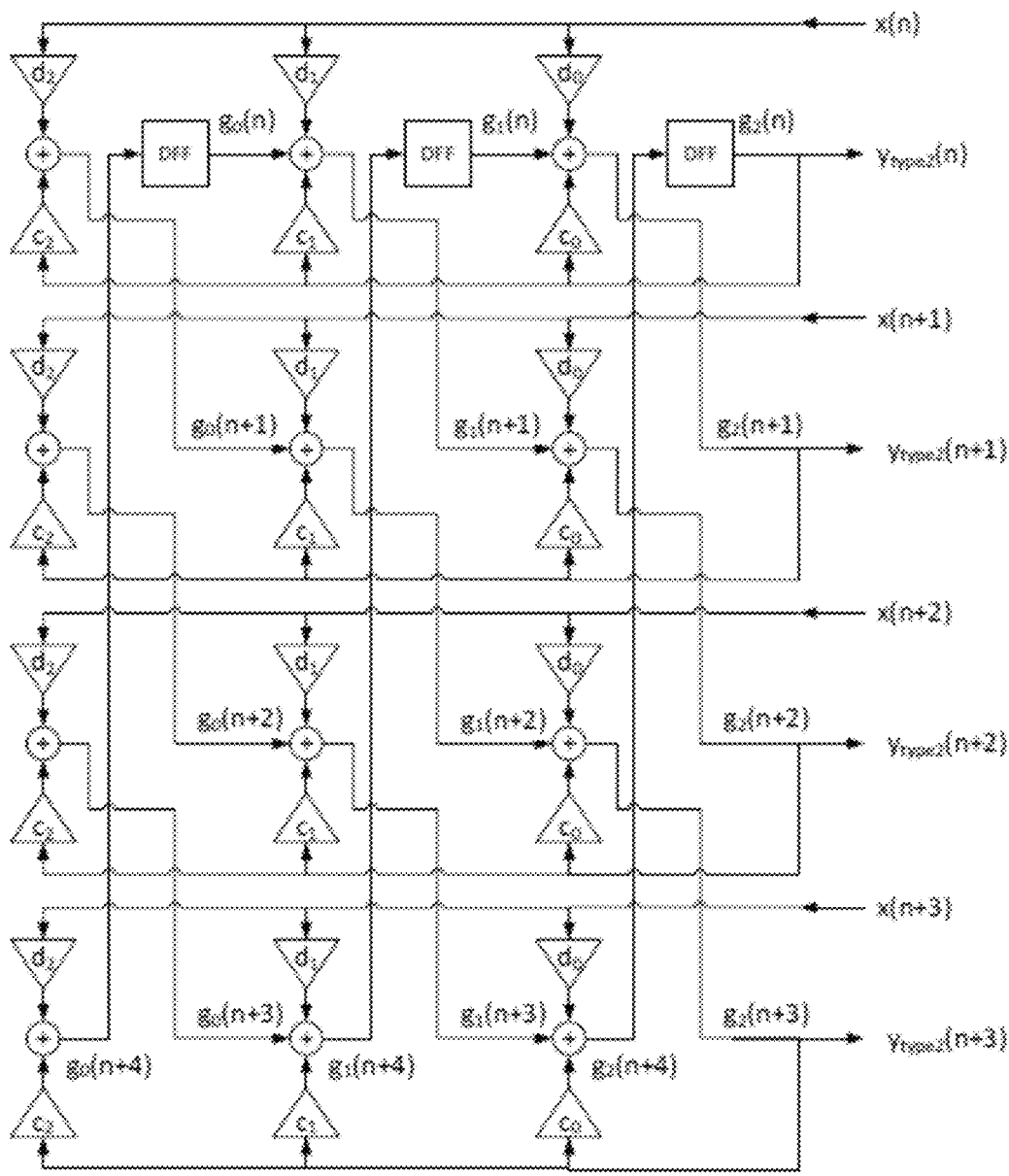
FIG. 5 illustrates a block diagram of a linear-feedback shift register circuit having a type 2 topology in accordance with an embodiment of the disclosure.

FIG. 5 illustrates a block diagram of an LFSR circuit 500 having a type 2 architecture. The LFSR circuit 500 may provide a parallel implementation of a serial type 2 LFSR circuit, such as an example three-tap serial LFSR circuit described with respect to FIG. 15. As exemplified in FIG. 5, a direct implementation/programming of a type 2 LFSR architecture is generally with associated with higher complexity than an associated implementation/programming of a type 1 LFSR architecture, such as shown in FIG. 4. In this regard, combiners are provided in-line with a path formed of state storage elements. Furthermore, in addition to coefficients $c_0$, $c_1$, and $c_2$ associated with a programmable generator polynomial, the LFSR circuit 500 also has coefficients $d_0$, $d_1$, and $d_2$ associated with a programmable data entry polynomial.

In an aspect, the coefficients $c_0$, $c_1$, and $c_2$ associated with a generator polynomial and/or $d_0$, $d_1$, and $d_2$ associated with a data entry polynomial can be reprogrammed on the fly. Such reprogrammability may be referred to as real-time programmability and may be desired or required in some applications. In another aspect, the coefficients remain constant (e.g., cannot be reprogrammed) during real-time operation of the associated LFSR. In some cases, while the coefficients are not real-time programmable, the coefficients can be reprogrammed (e.g., for different use cases) while the LFSR is idle.

As provided above, in various embodiments, the type 1 LFSR architecture may be associated with lower chip area (e.g., standard cell area) and/or better timing performance. As such, in some embodiments, rather than implement a type 2 LFSR architecture to directly generate type 2 outputs, the type 1 LFSR architecture, may be implemented and selectively connected to an output conversion logic circuit to convert the type 1 outputs to type 2 outputs if desired for a desired application. Equivalence between various aspects of the type 1 LFSR architecture and the type 2 LFSR architecture is described, for example, with respect to FIGS. 14-19.

Figure 6:
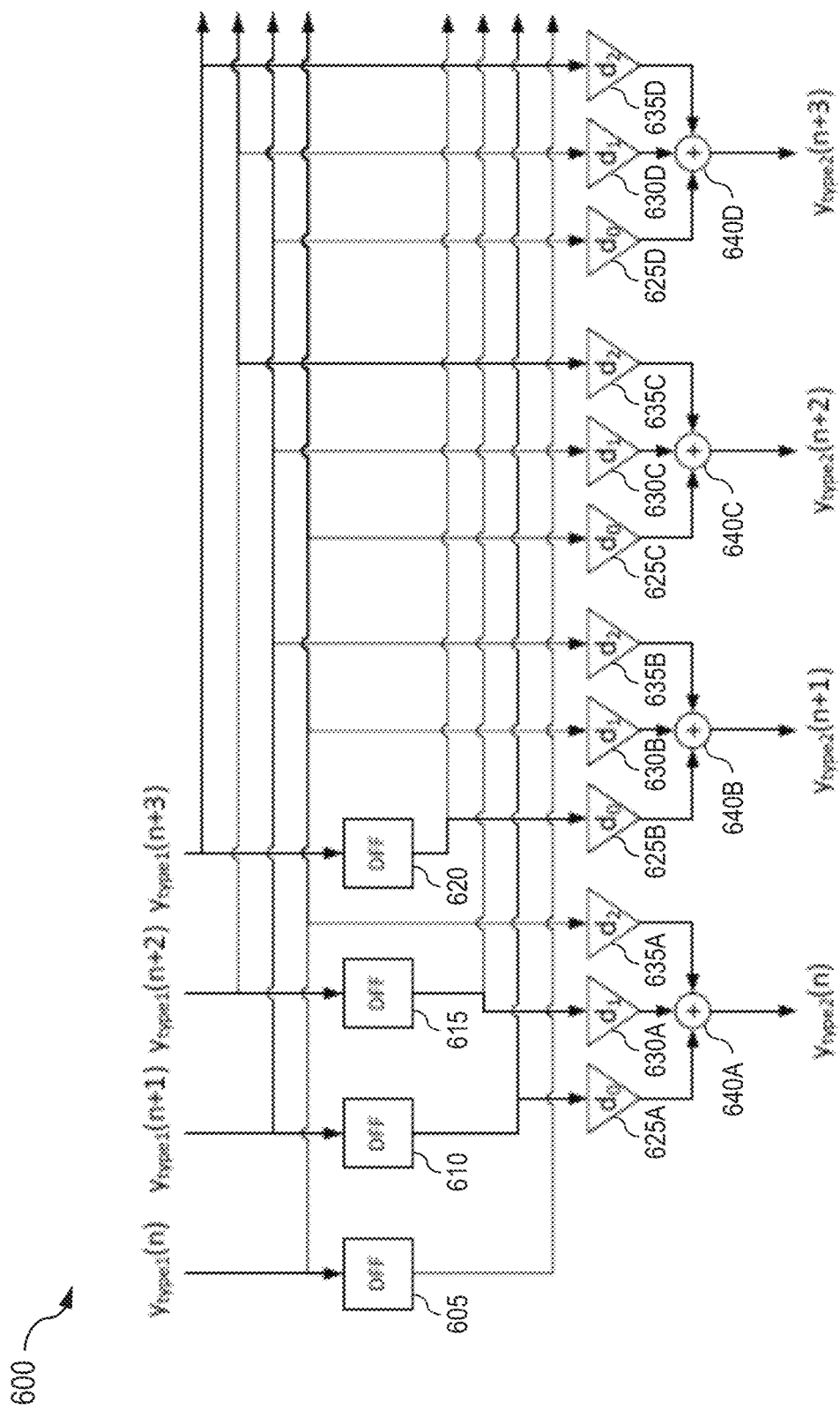
FIG. 6 illustrates a block diagram of an example output conversion logic circuit to convert from type 1 LFSR outputs to type 2 LFSR outputs in accordance with an embodiment of the disclosure.

FIG. 6 illustrates a block diagram of an example output conversion logic circuit 600 to convert from type 1 LFSR outputs to type 2 LFSR outputs in accordance with an embodiment of the disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the output conversion logic circuit 600 may be selectively programmed (e.g., enabled or disabled) based on whether type 2 outputs are desired.

The output conversion logic circuit 600 selectively receives type 1 outputs $y_{type1}(n)$, $y_{type1}(n+1)$, $y_{type1}(n+2)$, and $y_{type1}(n+3)$ from a type 1 LFSR circuit. For explanatory purposes, in some embodiments, the output conversion logic circuit 600 selectively receives the type 1 outputs $y_{type1}(n)$, $y_{type1}$ (n+1) $y_{type1}(n+2)$, and $y_{type1}(n+3)$ from the LFSR circuit 400 and generates type 2 outputs $y_{type2}$ (n), $y_{type2}(n+1)$, $y_{type2}(n+2)$, and $y_{type2}(n+3)$ of the LFSR circuit 500 of FIG. 5, although the output conversion logic circuit 600 may be selectively coupled to type 1 LFSR circuits described, for example, with respect to FIGS. 7-12, and/or generally any type 1 LFSR circuit (e.g., with adjustments to components and connections of the LFSR circuits and/or the output conversion logic circuit 600 to accommodate the appropriate number of inputs and/or outputs). In this regard, the output conversion logic circuit 600 provides a 4-bit parallel output conversion logic that corresponds to the 4-bit output of the LFSR circuits 400 and 500.

The output conversion logic circuit 600 includes state storage elements 605, 610, 615, and 620; multipliers 625A-D, 630A-D, and 635A-D; and combiners 640A-D. The state storage elements 605, 610, 615, and 620 are selectively connected to a type 1 LFSR circuit (e.g., the LFSR circuit 400) to selectively receive the outputs $y_{type1}(n)$, $y_{type1}(n+1)$ $y_{type1}(n+2)$, and $y_{type1}(n+3)$. The multiplier 625A is selectively connected to the state storage element 610. The multiplier 630A is selectively connected to the state storage element 615. The multiplier 635A is selectively connected to the type 1 LFSR circuit to selectively receive the output signal $y_{type1}(n)$ The multiplier 625B is selectively connected to the state storage element 620. The multiplier 630B is selectively connected to the type 1 LFSR circuit to selectively receive the output signal $y_{type1}(n)$ The multiplier 635B is selectively connected to the type 1 LFSR circuit to selectively receive the output signal $y_{type1}(n+1)$. The multiplier 625C is selectively connected to the type 1 LFSR circuit to selectively receive the output signal $y_{type1}(n)$ The multiplier 630C is selectively connected to the type 1 LFSR circuit to selectively receive the output signal $y_{type1}(n+1)$. The multiplier 635C is selectively connected to the type 1 LFSR circuit to selectively receive the output signal $y_{type1}(n+2)$. The multiplier 625D is selectively connected to the type 1 LFSR circuit to selectively receive the output signal $y_{type1}(n+1)$. The multiplier 630D is selectively connected to the type 1 LFSR circuit to selectively receive the output signal $y_{type1}(n+2)$. The multiplier 635D is selectively connected to the type 1 LFSR circuit to selectively receive the output signal $y_{type1}(n+3)$.

The combiner 640A is selectively connected to the multipliers 625A, 630A, and 635A and generates the output $y_{type2}(n)$ based on outputs of the multipliers 625A, 630A, and 635A. The combiner 640B is selectively connected to the multipliers 625B, 630B, and 635B and generates the output $y_{type2}(n+1)$ based on outputs of the multipliers 625B, 630B, and 635B. The combiner 640C is selectively connected to the multipliers 625C, 630C, and 635C and generates the output $y_{type2}(n+2)$ based on outputs of the multipliers 625C, 630C, and 635C.

The combiner 640D is selectively connected to the multipliers 625D, 630D, and 635D and generates the output $y_{type2}(n+3)$ based on outputs of the multipliers 625D, 630D, and 635D. It is noted that output taps to the right (e.g., the eight rightward pointing arrows) may be optional. These type 1 outputs (with or without buffering at the state storage elements 605, 610, 615, and 620) may be provided downstream to other processing circuitry.

As shown in FIG. 6, the output conversion logic circuit 600 has no feedback loop. In some cases, the output conversion logic circuit 600 may be pipelined (e.g., highly pipelined) by construction. A depth of logic of the output conversion logic circuit 600 depends on the number of taps and not the degree of parallelization. In various embodiments, such logic may be amenable to implementation in a high-speed circuit, and, as shown, the output conversion logic circuit 600 may be implemented in a high-speed circuit. Such logic contrasts logic associated with, for example, the LFSR circuits 400 of FIGS. 4 and 500 of FIG. 5, which generally depend on both the number of taps and the degree of parallelization. As such, the logic associated with the LFSR circuits 400 and 500 may be less amenable implementation in a high-speed circuit, especially for a type 2 LFSR architecture.

Figure 7:
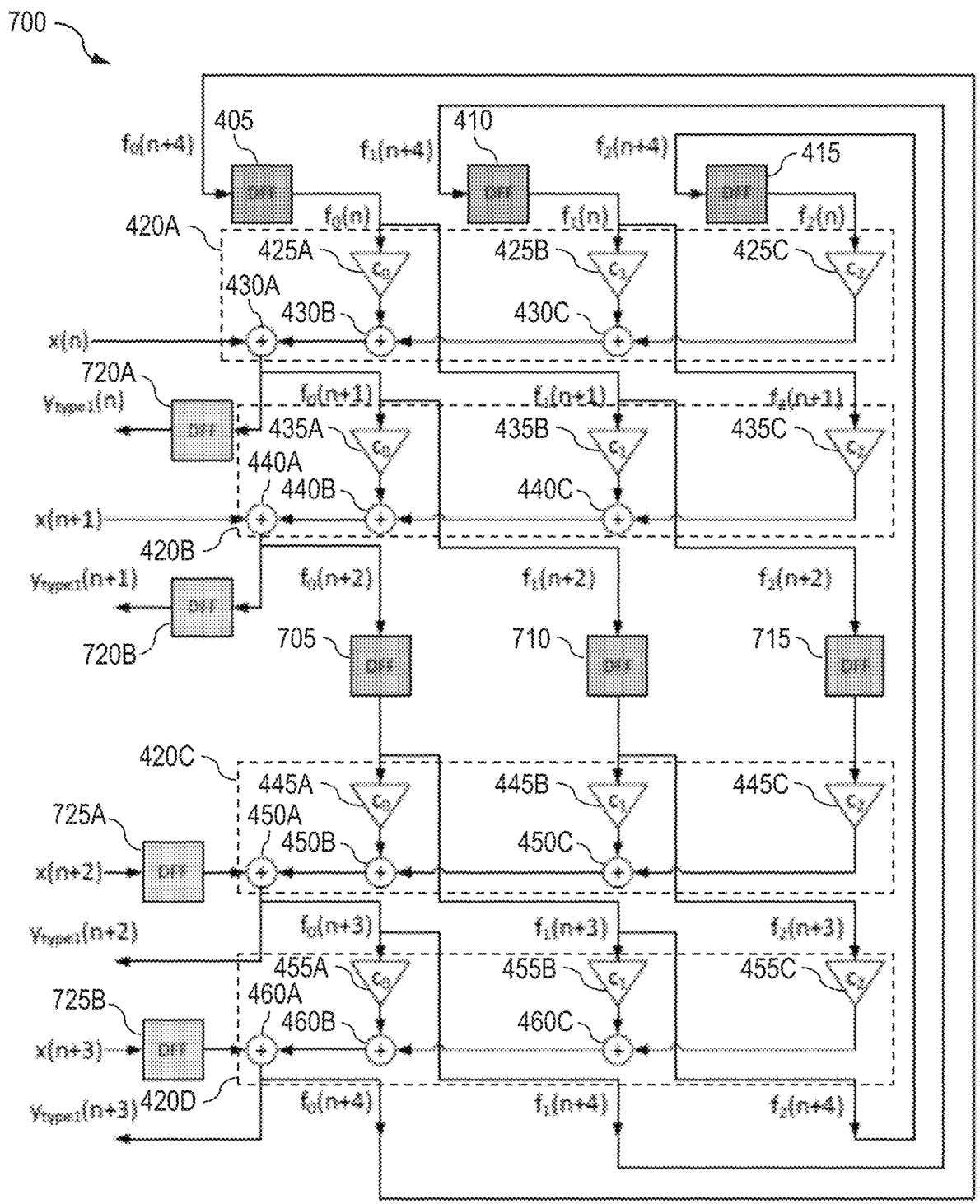
FIG. 7 illustrates a block diagram of a linear-feedback shift register circuit with pipeline elements and latency balance elements in accordance with an embodiment of the disclosure.

In some embodiment, pipeline stages may be used to allow for timing closure for an LFSR circuit with a high degree of parallelization operating at a high clock rate, such as a clock rate higher than 1 gigahertz. FIG. 7 illustrates a block diagram of an LFSR circuit 700 in accordance with an embodiment. The LFSR includes 700 includes the LFSR 400 of FIG. 4 with pipeline elements 705, 710, and 715 and latency balance elements 720A, 720B, 725A, and 725B provided therein. Each state storage element and pipeline element may be a memory cell to store (e.g., buffer) a state signal of the LFSR circuit 700. Each latency balance element may be a memory cell to store (e.g., buffer) an input signal or an output signal of the LFSR circuit 700. As a non-limiting example, each state storage element, pipeline element, and latency balance element may be implemented by a flip-flop (e.g., D-type flip-flop). In an aspect, the LFSR circuit 700 may be referred to as a 4-bit pipelined parallel LFSR circuit.

The pipeline element 705 is selectively connected to the combiner 440A, the multiplier 445A, the multiplier 455B, and the state storage element 415. The pipeline element 710 is selectively connected to the combiner 430A, the multiplier 445B, and the multiplier 455C. The pipeline element 715 is selectively connected to the storage element 405 and the multiplier 445C. The pipeline elements 705, 710, and 715 may collectively provide and be referred to as a pipeline stage between a first set of logic stages (e.g., also referred to as bit stages or simply as stages) that precede the pipeline stage and a second set of logic stages that follow the pipeline stage. In this regard, the pipeline elements 705, 710, and 715 are inserted after two logic stages. The first set of stages includes the programmable logic stage circuits 420A and 420B, and is associated with the input signals $x(n)$ and $x(n+1)$; state signals $f_0(n)$, $f_1(n)$, $f_2(n)$, $f_0(n+1)$, $f_1(n+1)$, and $f_2(n+1)$; and output signals $y_{type1}(n)$ and $y_{type1}(n+1)$. The second set of stages includes the programmable logic stage circuits 420C and 420D, and is associated with the input signals $x(n+2)$ and $x(n+3)$; state signals $f_0(n+3)$, $f_1(n+3)$, $f_2(n+3)$, $f_0(n+4)$, $f_1(n+4)$, and $f_2(n+4)$; and output signals $y_{type1}(n+2)$ and $y_{type1}(n+3)$. In an aspect, the LFSR circuit 700 may be considered to provide a sequential combinatorial path formed of sequential elements/connections and divided into sets of stages by the pipeline stage.

The latency balance elements 720A, 720B, 725A, and 725B are provided to balance operational time units (e.g., clock cycles) associated with the first set of logic stages and the second set of logic stages due to insertion of the pipeline elements 705, 710, and 715. The output signals $y_{type1}(n)$ and $y_{type1}(n+1)$ associated with the first set of stages (e.g., the set of stages that precede the pipeline stage) are pipelined (e.g., delayed, buffered) such that these output signals are provided by (e.g., output by) the LFSR circuit 700 at the same time unit (e.g., same clock cycle) as the output signals $y_{type1}(n+2)$ and $y_{type1}(n+3)$ associated with the second set of stages (e.g., the set of stages that follow the pipeline stage). The input signals $x(n+2)$ and $x(n+3)$ associated with the second set of stages are pipelined such that these inputs are provided for processing (e.g., by the combiners 450A and 460A) at the same time unit as the input signals $x(n)$ and $x(n+1)$ associated with the first set of stages.

In this regard, as shown in FIG. 7, the output signals $y_{type1}(n)$ and $y_{type1}(n+1)$ associated with the first set of stages are pipelined by the latency balance elements 720A and 720B, respectively. With such pipelining applied to the output signals $y_{type1}(n)$ and $y_{type1}(n+1)$, the output signals $y_{type1}(n)$ and $y_{type1}(n+1)$ can be output from the LFSR circuit 700 at the same time unit as the output signals $y_{type1}(n+2)$ and $y_{type1}(n+3)$ which follow the pipeline stage. In this regard, the pipelining applied to the output signals $y_{type1}(n)$ and $y_{type1}(n+1)$ by the latency balance elements 720A and 720B, respectively, balances the pipelining applied by the pipeline elements 705, 710, and 715 to the output signals $y_{type1}(n+2)$ and $y_{type1}(n+3)$. Without the pipelining by the latency balance elements 720A and 720B, the output signals $y_{type1}(n)$ and $y_{type1}(n+1)$ may be output by the LFSR 700 circuit at an earlier time unit (e.g., one clock cycle earlier) than the output signals $y_{type1}(n+2)$ and $y_{type1}(n+3)$.

The input signals $x(n+2)$ and $x(n+3)$ associated with the second set of stages are pipelined by the latency balance elements 725A and 725B, respectively. With such pipelining applied to the input signals $x(n+2)$ and $x(n+3)$, the input signals $x(n+2)$ and $x(n+3)$ can be provided to the combiners 435C and 435D, respectively, at the same time unit that the input signals $x(n)$ and $x(n+1)$ are provided to the combiners 435A and 435B, respectively. In this regard, the pipelining applied to the input signals $x(n+2)$ and $x(n+3)$ align the input signals $x(n+2)$ and $x(n+3)$ with signals delayed by the pipeline elements 705, 710, and 715. Without the pipelining by the latency balance elements 725A and 725B, the input signals $x(n+2)$ and $x(n+3)$ arrive at an earlier time unit (e.g., one clock cycle earlier) than signals (e.g., the signals $f_0(n+2)$, $f_1(n+2)$, and $f_2(n+2)$) that are provided as input into and delayed by the pipeline elements 705, 710, and 715.

Figure 8:
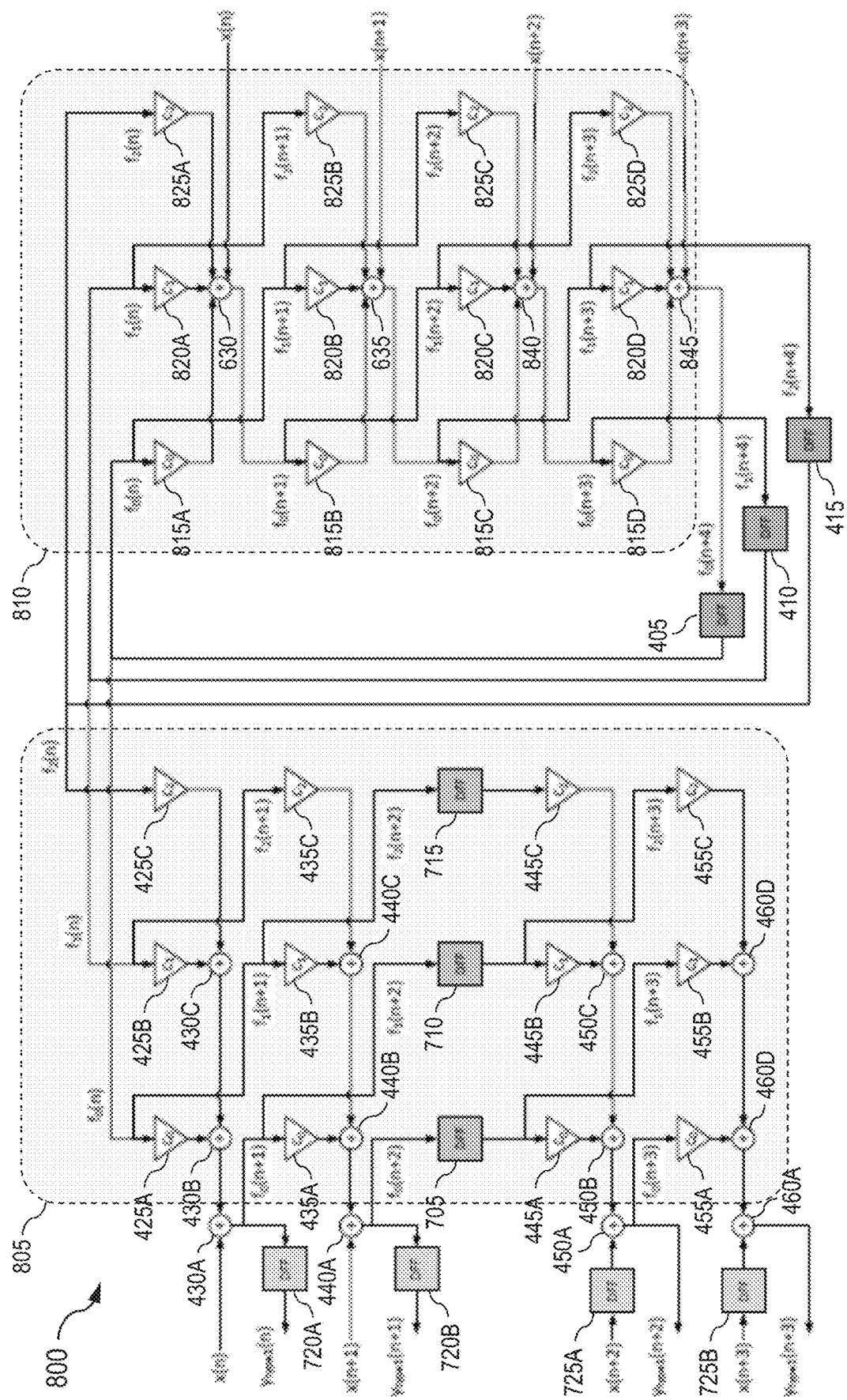
FIG. 8 illustrates a block diagram of a linear-feedback shift register circuit with feedforward logic and feedback logic separated in accordance with an embodiment of the disclosure.

FIG. 8 illustrates an LFSR circuit 800 in accordance with an embodiment of the disclosure. The LFSR circuit 800 includes various programmable components and programmable routing resources shown in the LFSR circuit 400 of FIG. 4 and the LFSR circuit 700 of FIG. 7. In this regard, the foregoing description of FIGS. 4 and 7 generally applies to FIG. 8, with examples of differences and other description provided herein. In some cases, since the pipeline stage in the LFSR circuit 700 is in the path of the feedback loop in the LFSR circuit 700, a transition from a current state to a next state may take two time units (e.g., two clock cycles) instead of one. In an aspect, the LFSR circuit 800 may be referred to as a 4-bit pipelined parallel LFSR circuit.

In some cases, the pipeline elements 705, 710, and 715 of the LFSR circuit 700 may be associated with a reduction in throughput (e.g., compared to an architecture without the pipeline elements 705, 710, and 715). Throughput reduction associated with the LFSR circuit 700 may be mitigated/avoided (e.g., if desired for an application) by taking feedback logic out of the pipelined path. In this regard, combinatorial logic of the LFSR circuit 800 is separated into a pipelined feedforward logic portion 805 and a feedback logic portion 810. As described in relation to the LFSR circuits 400 and 700 of FIGS. 4 and 7, the LFSR circuit 800 includes the state storage elements 405, 410, and 415, the multipliers 425A-C, 435A-C, 445A-C, and 455A-C, the combiners 430A-C, 440A-C, 450A-C, and 460A-C, the pipeline elements 705, 710, and 715, and the latency balance elements 720A, 720B, 725A, and 725B. In addition to these various programmable components described in relation to the LFSR circuits 400 and 700 of FIGS. 4 and 7, the LFSR circuit 800 also includes multipliers 815A-D, 820A-D, and 825A-D, and combiners 830, 835, 840, and 845, which form the feedback logic portion 810 of the LFSR circuit 800.

In FIG. 8, the combiners 435D, 440D, and 445D are not selectively connected to the storage elements 405, 410, and 415, respectively, as shown in FIG. 7, thus removing the feedback loops of FIG. 7 and separating/replicating logic of the LFSR circuit 800 into the pipelined feedforward logic portion 805 and the feedback logic portion 810. The storage element 405 is selectively connected to the multipliers 815A, 820B, and 825C. The storage element 410 is selectively connected to the multipliers 820A and 825B. The storage element 415 is selectively connected to the multiplier 825A. The multipliers 815A, 820A, and 825A are selectively connected to the combiner 830. The combiner 830 is selectively connected to the multipliers 815B, 820C, and 825D. The multipliers 815B, 820B, and 825B are selectively connected to the combiner 835. The combiner 835 is selectively connected to the multipliers 815C and 820D and the state storage element 415. The multipliers 815C, 820C, and 825C are selectively connected to the combiner 840. The combiner 840 is selectively connected to the multiplier 815D and the state storage element 415.

As shown in FIG. 8, logic of the feedback logic portion 810 has a similar complexity as logic of the feedforward logic portion 805. The feedforward logic portion 805 is associated with generation of the primary output vector (e.g., formed of the primary output signals $y_{type1}(n)$, $y_{type1}(n+1)$, $y_{type1}(n+2)$, and $y_{type1}(n+3)$) of the LFSR circuit 800 based in part on the next-state matrix. As such, the feedforward logic portion 805 may be referred to as an output logic circuit. In some cases, the feedforward logic portion 805 may be referred to as providing a critical path since it provides the path/portion associated with generating the primary output signals. In an aspect, separating the LFSR logic into the feedforward logic portion 805 and the feedback logic portion 810 may separate the critical path (e.g., of the feedforward logic portion 805) from remaining LFSR logic. In this regard, the output signals at time unit n+1, n+2, and so forth until n+N (e.g., N=3 for the 4-bit case in the LFSR circuit 800) are preserved. Logic architecture may compute the value at n+1 as a function of the value at n, the value at n+2 as a function of the value at n+1, and so forth. Such a computation involves the original next-state matrix at each stage, and the N-times matrix multiplication is achieved by the combination of N stages. As the output signals are involved, degrees of freedom for a logic synthesis tool, such as freedom to replicate logic, combine logic, restructure logic, and so forth may generally be more limited. In some cases, a pipeline stage(s) may be used to reduce the critical path to allow for logic optimization reduction of the critical path from N to N/P, where P is the number of pipeline stages. Input and output latency may be inserted so inputs and outputs of all stages arrive at the appropriate time unit (e.g., the appropriate clock cycle).

By contrast, nodes generating the primary output signals $y_{type1}(n)$, $y_{type1}(n+1)$, $y_{type1}(n+2)$, and $y_{type1}(n+3)$ need not be preserved in the feedback logic portion 810 (e.g., the feedback logic portion 810 does not involve the output signals). Since the output signals need not be preserved, the logic synthesis tool may have more degrees of freedom to optimize logic of the feedback logic portion 810 (e.g., such optimization is not shown in FIG. 8). In this regard, the feedback logic portion 810 involves internal state computation, in which multiplication of the next-state matrix with itself multiple times. In cases that the coefficients are not re-programmed in real time, such matrix multiplications are not on the critical path. As such, in some cases, matrix multiplication circuitry (e.g., multipliers and combiners) may be implemented with small and/or slow transistors or logic gates which are generally associated with low power consumption (e.g., compared with larger and/or faster transistors/gates). Such matrix multiplications performed by the feedback logic portion 810 may be considered non-time-critical and, for cases in which the coefficients (e.g., $c_2$, $c_1$, $c_0$) are not real-time programmable, can be pre-calculated. In some cases, only a final stage where the resulting matrix is multiplied with the real-time state and input vectors is considered on the critical path. A length of the critical path may be at most N and may be reduced to log N through optimization (e.g., similar to reduction as fast N-bit adders) using RTL synthesis tools. As such, the LFSR circuit 800 may allow for optimized calculation of a time-critical next-state vector by leveraging synthesis techniques.

Pipeline stages of the feedforward logic portion 805 generally do not affect operation of the feedback logic portion 810. In an aspect, pipeline stages may be inserted in the feedback logic portion 810. In some cases, latency balance elements are not inserted in the feedback logic portion 810 (e.g., even if pipeline stages are inserted in the feedback logic portion 810). The number of pipeline stages in the feedforward logic portion 805 may be different from the number of pipeline stages in the feedback logic portion 810. As examples, the number of pipeline stages in the feedback logic portion 810 may be the same or fewer than the number of pipeline stages in the feedforward logic portion 805. In some cases, any pipeline element in the feedforward logic portion 805 affects latency associated with the feedforward logic portion 805 and not throughput, whereas any pipeline element in the feedback logic portion 810 may affect latency and throughput. In some cases, the logic of the feedback logic portion 810 may be optimizable to an extent that timing can be met even without any pipeline stage (e.g., in the feedback logic portion 810 as shown in FIG. 8).

Figure 9:
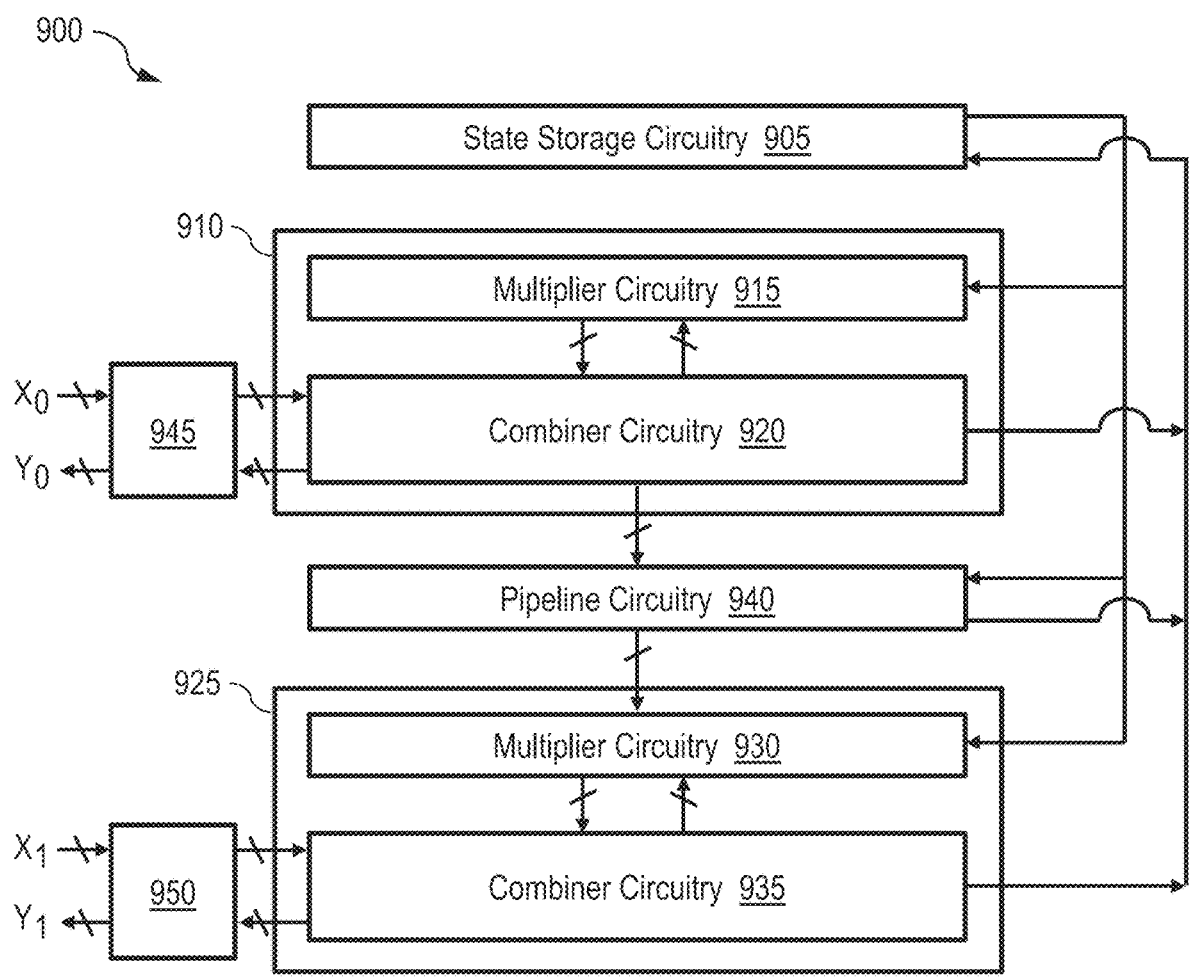
FIG. 9 illustrates a block diagram of a linear-feedback shift register circuit with pipeline elements and latency balance elements in accordance with an embodiment of the disclosure.

FIG. 9 illustrates a block diagram of an LFSR circuit 900 in accordance with an embodiment of the disclosure. The LFSR circuit 900 includes state storage circuitry 905, a set 910 of programmable logic stage circuits, a set 925 of programmable logic stage circuits, pipeline circuitry 940, latency balance circuitry 945, and latency balance circuitry 950. The set 910 of programmable logic stage circuits includes multiplier circuitry 915 and combiner circuitry 920. The set 925 of programmable logic stage circuits includes multiplier circuitry 930 and combiner circuitry 935.

For explanatory purposes, the LFSR circuit 900 is primarily described as a representation of the LFSR circuit 700 of FIG. 7, although the LFSR circuit 900 may represent other LFSR circuits. With reference to the LFSR circuit 700 of FIG. 7, the state storage circuitry 905 may include the state storage elements 405, 410, and 415. The set 910 of programmable logic stage circuits may include the programmable logic stage circuits 420A and 420B. The set 925 of programmable logic stage circuits may include the programmable logic stage circuits 420C and 420D. The multiplier circuitry 915 may include the multipliers 425A-C and 435A-C. The combiner circuitry 920 may include the combiners 430A-C and 440A-C. The combiner circuitry 920 may receive the input signals x(n) and x(n+1) (denoted as an input vector $X_0$ in FIG. 9) and may generate the output signals $y_{type1}(n)$ and $y_{type1}(n+1)$ (denoted as an output vector $y_0$ in FIG. 9). The multiplier circuitry 930 may include the multipliers 445A-C and 455A-C. The combiner circuitry 935 may include the combiners 450A-C and 460A-C. The combiner circuitry 935 may receive the input signals x(n+2) and x(n+3) (denoted as an input vector $X_1$ in FIG. 9) and may generate the output signals $y_{type1}(n+2)$ and $y_{type1}(n+3)$ (denoted as an output vector $y_1$ in FIG. 9). The numerical subscript 0 in $X_0$ and $y_0$ and 1 in $X_1$ and $y_1$ may indicate that the input vector $X_0$ and the output vector $y_0$ is associated with a zeroth set (e.g., the set 910) of programmable logic stage circuits and the input vector $X_1$ and the output vector $y_1$ is associated with a first set (e.g., the set 925) of programmable logic stage circuits. The pipeline circuitry 940 may include the pipeline elements 705, 710, and 715. The latency balance circuitry 945 may include the latency balance elements 720A and 720B, which apply a delay to the output signals $y_{type1}(n)$ and $y_{type1}(n+1)$, respectively. The latency balance circuitry 950 may include the latency balance elements 725A and 725B, which apply a delay to the input signals x(n+2) and x(n+3), respectively.

Various arrows in FIG. 9 show selective connections (e.g., selective signal transfer) between the various components of the LFSR circuit 900 of FIG. 9. In this regard, the state storage circuitry 905 selectively provides state signals to multiplier circuitry of the sets 910 and/or 925 of programmable logic stage circuits and/or the pipeline circuitry 940 and selectively receives state signals from combiner circuitry via feedback paths. As an example, with reference to FIG. 7, the state storage element 410 selectively receives the state signal $f_1(n+4)$ from the combiner 450A of the programmable logic stage circuit 420C. Each combiner circuitry selectively provides outputs to the pipeline circuitry 940 and/or multiplier circuitry. As an example, the combiner 430A of the programmable logic stage circuit 420A selectively provides the state signal $f_0(n+1)$ to the multiplier 435A of the programmable logic stage circuit 420B.

As shown in FIGS. 7 and 9, the pipeline circuitry 940 divides the programmable logic stage circuits of the LFSR circuit 900 into the set 910 and the set 925, with each set having latency balance circuitry positioned at its input path(s) and/or its output path(s). In this regard, the pipeline circuitry 940 may be referred to as a pipeline stage. In an aspect, for a given input and output pair at the same time unit (e.g., x(n) and $y_{type1}(n)$ form a pair, x(n+2) and $y_{type1}(n+2)$ form another pair), a sum of the number of latency balance elements applied to the input signal and the number of latency balance elements applied to the output signal is equal to the number of pipeline stages. With FIGS. 7 and 9 having a single pipeline stage, the set 910 has one latency balance element positioned at each output path and no latency balance element positioned at each input path, and the set 925 has one latency balance element positioned at each input path and no latency balance element positioned at each output path.

Figure 10:
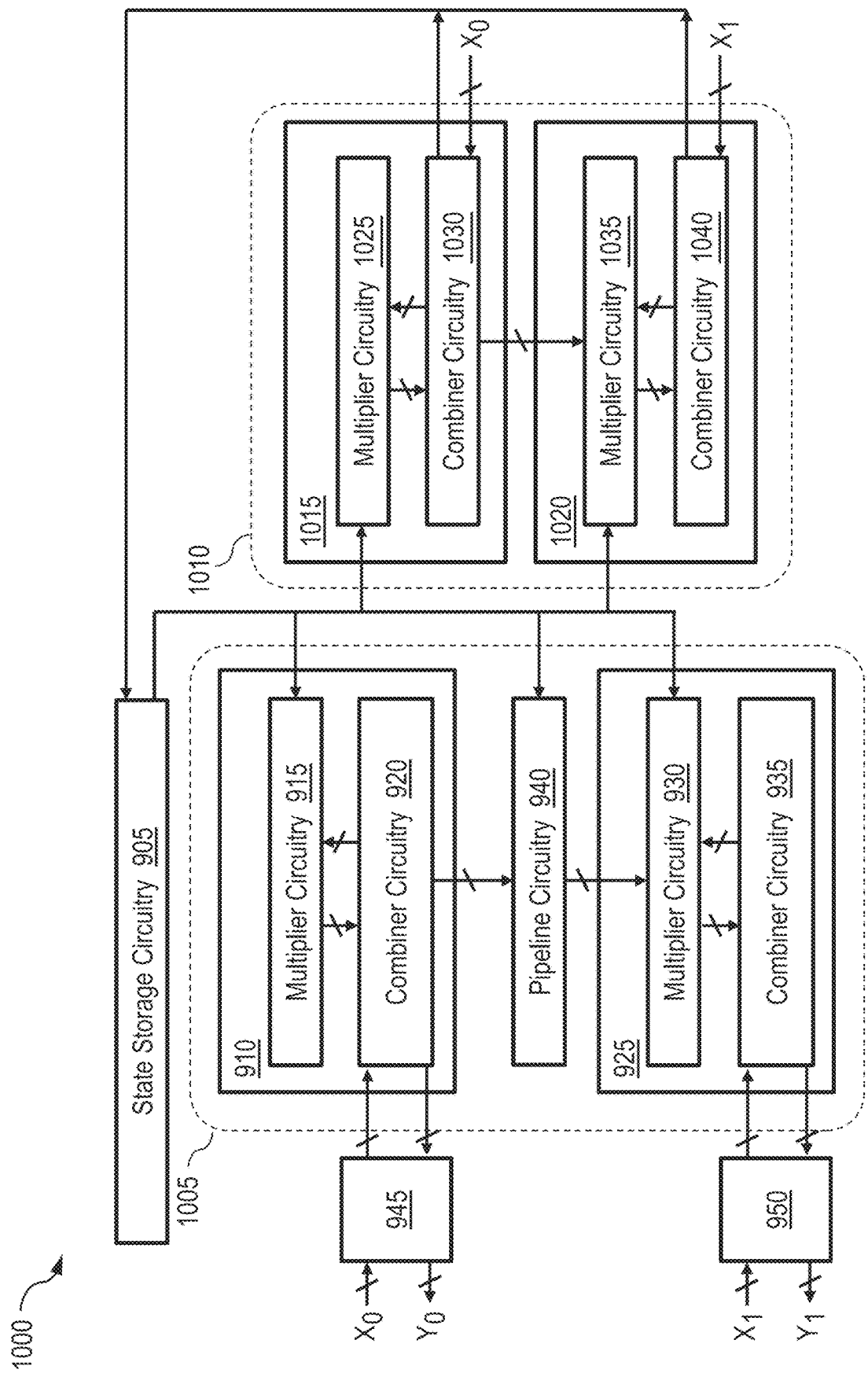
FIG. 10 illustrates a block diagram of a linear-feedback shift register circuit with feedforward logic and feedback logic separated in accordance with an embodiment of the disclosure.

FIG. 10 illustrates a block diagram of an LFSR circuit 1000 in accordance with an embodiment of the disclosure. For explanatory purposes, the LFSR circuit 1000 is primarily described as a representation of the LFSR circuit 800 of FIG. 8, although the LFSR circuit 1000 may represent other LFSR circuits. As such, the description of the LFSR circuit 800 of FIG. 8 generally applies to the LFSR circuit 1000.

The LFSR circuit 1000 includes various programmable components and programmable routing resources shown in the LFSR circuit 800 of FIG. 8. The LFSR circuit 1000 includes a pipelined feedforward logic portion 1005 and a feedback logic portion 1010. In addition to the various programmable components described in relation to the LFSR circuit 800, the LFSR circuit 1000 also includes programmable logic state circuits 1015 and 1020, which form the feedback logic portion 1010 of the LFSR circuit 1000. The programmable logic state circuit 1015 may be considered to correspond to the programmable logic state circuit 910 since the programmable logic state circuits 910 and 1015 selectively receive the input signals associated with the input vector $X_0$. The programmable logic state circuit 1020 may be considered to correspond to the programmable logic state circuit 925 since the programmable logic state circuits 925 and 1020 selectively receive the input signals associated with the input vector $X_1$.

In some cases, as shown in FIG. 10, no pipeline stage is provided between the programmable logic stage circuits 1015 and 1020. The programmable logic circuit 1015 includes multiplier circuitry 1025 and combiner circuitry 1030. The programmable logic circuit 1020 includes multiplier circuitry 1035 and combiner circuitry 1040.

Although the foregoing describes LFSR circuits with a single pipeline stage, in some embodiments the LFSR circuits may have two or more pipeline stages. In some aspects, multiple pipeline stages may be used to allow for more input signals and/or more output signals (e.g., more pipeline stages to accommodate more than the four input signals and/or four output signals described with respect to FIGS. 4-10). In some cases, the LFSR circuits may be programmably expanded. For example, additional multipliers, combiners, etc. may be programmed as appropriate to expand beyond four bits shown in FIGS. 4-10.

Figure 11:
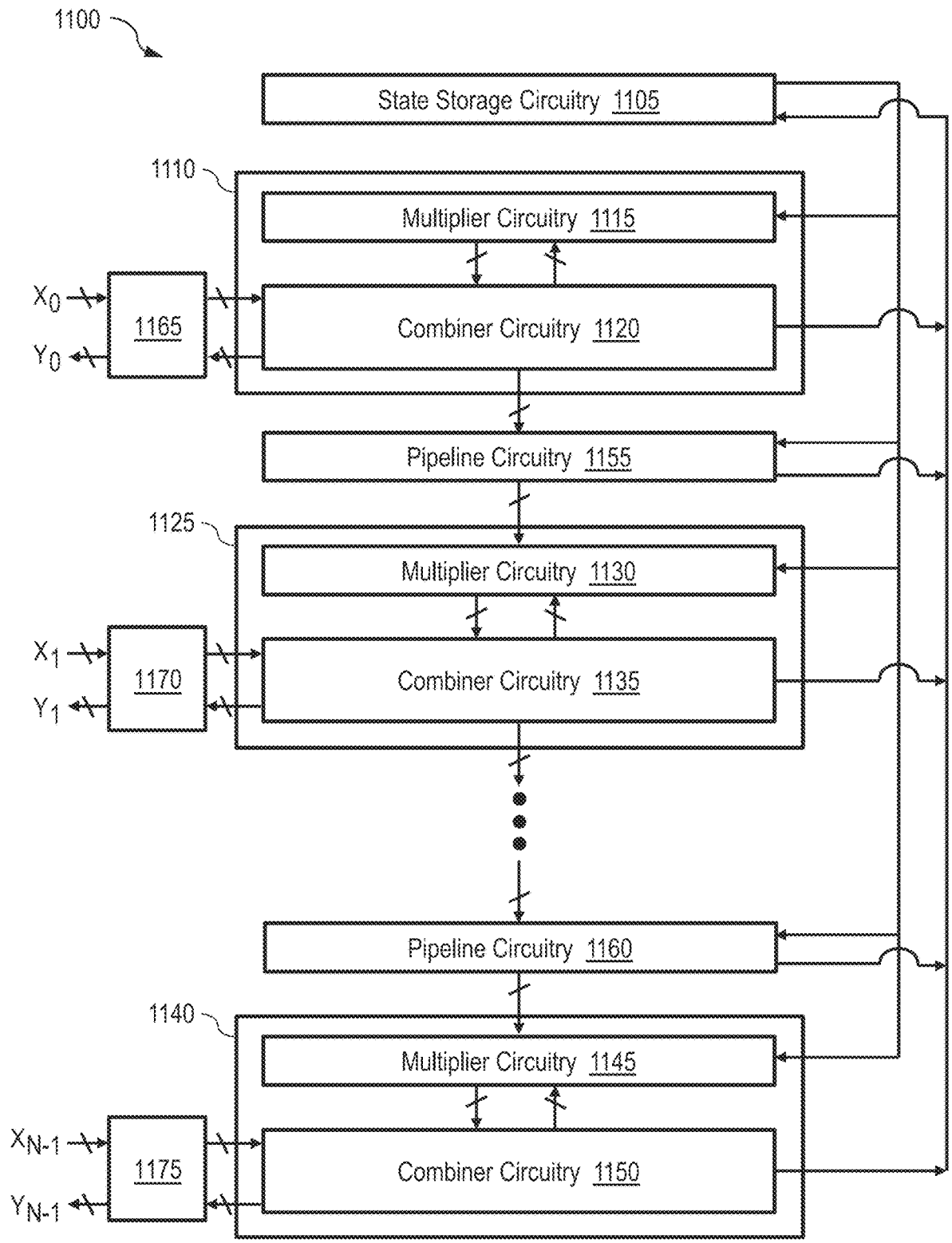
FIG. 11 illustrates a block diagram of a linear-feedback shift register circuit with pipeline elements and latency balance elements in accordance with an embodiment of the disclosure.

FIG. 11 illustrates a block diagram of an LFSR circuit 1100 having multiple pipeline stages in accordance with an embodiment of the disclosure. The LFSR circuit 1100 includes state storage circuitry 1105, sets 1110, 1125, and 1140 of programmable logic stage circuits, pipeline circuitry 1155 and 1160, and latency balance circuitry 1165, 1170, and 1175. The set 1110 of programmable logic stage circuits includes multiplier circuitry 1115 and combiner circuitry 1120. The set 1110 (e.g., zeroth set) selective receives an input vector $X_0$ and provides an output vector $Y_0$. The set 1125 of programmable logic stage circuits includes multiplier circuitry 1130 and combiner circuitry 1135. The set 1125 (e.g., first set) selective receives an input vector $X_1$ and provides an output vector $Y_1$. The set 1140 (e.g., N–$1^{st}$ set)

of programmable logic stage circuits include multiplier circuitry 1145 and combiner circuitry 1150. The set 1140 selective receives an input vector $X_{N-1}$ and provides an output vector $y_{N-1}$.

In FIG. 11, N−1 pipeline stages/circuitries divide the programmable logic stage circuits of the LFSR circuit 1100 into N sets of programmable logic stages, of which the sets 1110, 1125, and 1140 are shown in FIG. 11. In this regard, it is noted that ellipses between the set 1125 and the pipeline circuitry 1160 may represent one or more additional pipeline circuitries and programmable logic stage circuits, or no pipeline circuitry and programmable logic stage circuits are present between the set 1125 and the pipeline circuitry 1160. Each pipeline stage provides a dividing line that indicates/defines latency balance circuitry to be inserted at input paths and/or output paths.

In an embodiment, for any given programmable logic stage, a sum of the number of latency balance elements applied to an input signal and the number of latency balance elements applied to an output signal is equal to the number of pipeline stages. In this regard, with N−1 pipeline stages, the sum is also N−1. A number of pipeline stages may be determined based on application, technology (e.g., silicon technology) on which an LFSR is implemented, and associated timing requirements. In one example, an LFSR circuit may have 32 programmable logic stages with three pipeline stages inserted therein. The pipeline stages may, but need not, be inserted substantially equidistant from each other (e.g., after an eighth stage, sixteenth stage, and twenty-fourth stage).

As an example, in a case with two pipeline stages (e.g., the LFSR circuit 1100 includes the pipeline circuitry 1155 and the pipeline circuitry 1160), each programmable logic stage circuit may have two latency balance elements distributed across each input/output pair. The latency balance circuitry 1165 coupled to each programmable logic stage circuit of the set 1110 may include two latency balance elements applied to each output path of the programmable logic stage circuit. No latency balance circuitry is coupled to each input path of the programmable logic stage circuits of the set 1110. The latency balance circuitry 1170 coupled to each programmable logic stage circuit of the set 1125 may include one latency balance element applied to each input path of the programmable logic stage circuit and one latency balance element applied to each output path of the programmable logic stage circuit. The latency balance circuitry 1175 coupled to each programmable logic stage circuit of the set 1140 may include two latency balance elements applied to each input path of the programmable logic stage circuit of the set 1140. No latency balance circuitry is coupled to each output path of the programmable logic stage circuits of the set 1140.

As another example, in a case with three pipeline stages (e.g., the LFSR circuit 1100 includes the pipeline circuitry 1155, the pipeline circuitry 1160, and one pipeline circuitry between the set 1125 and the pipeline circuitry 1160), each programmable logic stage circuit has three latency balance elements distributed across each input/output pair. The latency balance circuitry 1165 coupled to each programmable logic stage circuit of the set 1110 may include three latency balance elements applied to each output path of the programmable logic stage, and no latency balance circuitry is coupled to each input path of the programmable logic stage circuits of the set 1110. The latency balance circuitry 1170 coupled to each programmable logic stage circuit of the set 1125 may represent one latency balance element applied to each input path of the programmable logic stage and two latency balance elements applied to each output path of the programmable logic stage circuit. Latency balance circuitry (not explicitly shown in FIG. 11) for a set of programmable logic stage circuits between the set 1125 and the set 1140 may include two latency balance elements applied to each input path and one latency balance element applied to each output path. The latency balance circuitry 1175 coupled to each programmable logic stage circuit of the set 940 may include three latency balance elements applied to each input path of the programmable logic stage circuit of the set 1140, and no latency balance circuitry is coupled to each output path of the programmable logic stage circuits of the set 1140.

As shown with respect to FIGS. 9 and 11, the LFSR circuit 900 of FIG. 9 provides the case in which N=2 and thus may be derived from the LFSR circuit 1100 of FIG. 11 by removing circuitry (e.g., disabling circuitry)) that follow the programmable logic stage circuit 925 to obtain an LFSR architecture that uses a single pipeline stage. In the LFSR circuit 900 of FIG. 9, a single pipeline stage separate programmable logic stage circuits into two sets of programmable logic stage circuits (e.g., the set 910 and the set 925), in which a first set (e.g., the set 910) has a single latency balance element (e.g., 720A, 720B) at each output path and no latency balance element at each input path, and a second set (e.g., the set 925) has a single latency balance element (e.g., 725A, 725B) at each input path and no latency balance element at each output path. As such, the description of FIG. 9 generally applies to FIG. 11, with examples of differences and other description provided herein.

Figure 12:
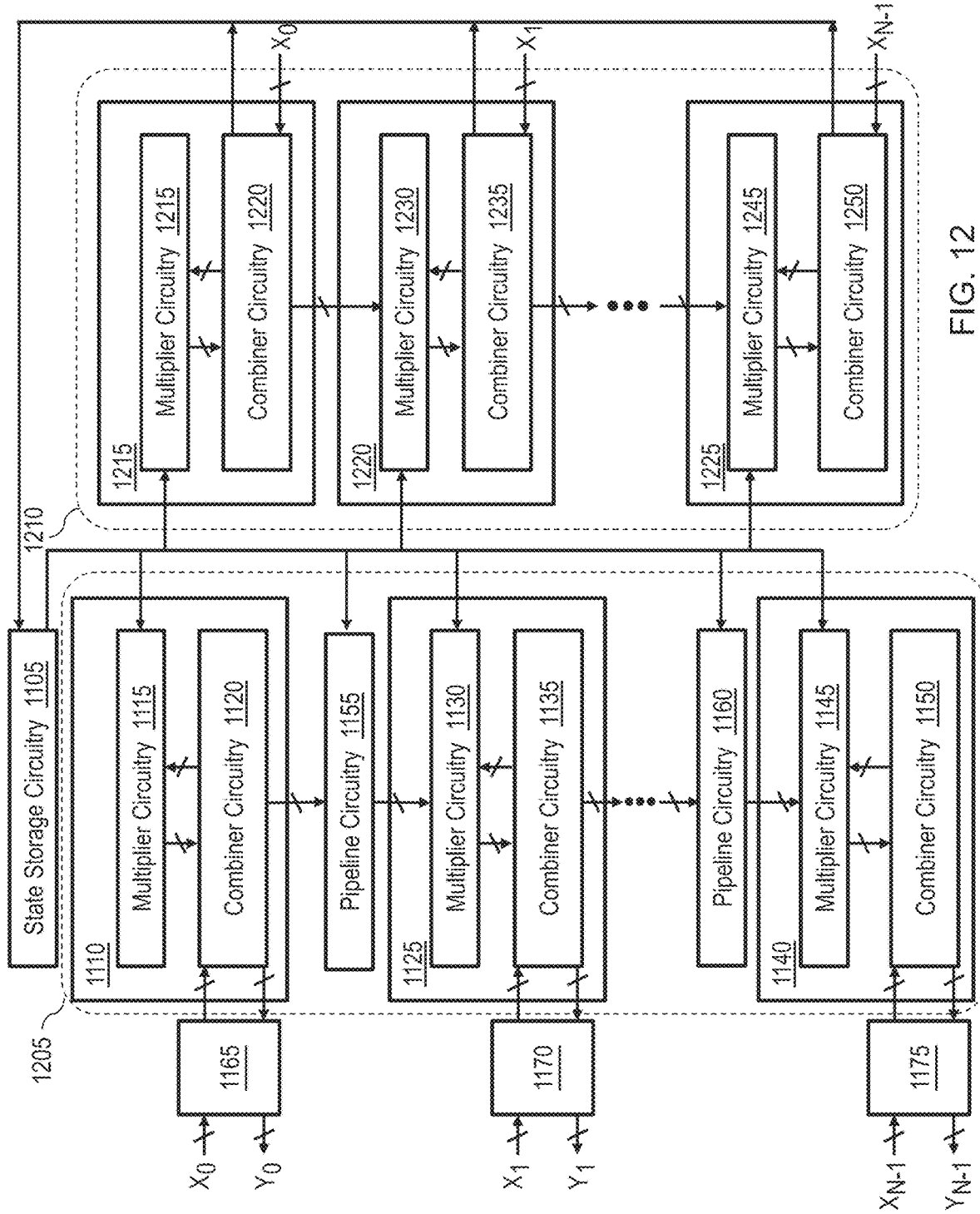
FIG. 12 illustrates a block diagram of a linear-feedback shift register circuit with feedforward logic and feedback logic separated in accordance with an embodiment of the disclosure.

FIG. 12 illustrates a block diagram of an LFSR circuit 1200 in accordance with an embodiment. The LFSR circuit 1200 includes various programmable components and programmable routing resources shown in the LFSR circuit 1100 of FIG. 11 and includes additional stages relative to the LFSR circuit 1000 of FIG. 10. With reference to FIG. 11, feedback loops of FIG. 11 are removed and logic of the LFSR circuit 1100 separated/replicated to form a pipelined feedforward logic portion 1205 and a feedback logic portion 1210. In addition to the various programmable components described in relation to the LFSR circuit 1100, the LFSR circuit 120 also includes programmable logic state circuits 1215, 1220, and 1225, which form the feedback logic portion 1210 of the LFSR circuit 1200. The programmable logic state circuit 1215 may be considered to correspond to the programmable logic state circuit 1110 since the programmable logic state circuits 1110 and 1215 selectively receive the input signals associated with the input vector $X_0$. The programmable logic state circuit 1220 may be considered to correspond to the programmable logic state circuit 1125 since the programmable logic state circuits 1125 and 1220 selectively receive the input signals associated with the input vector $X_1$. The programmable logic state circuit 1225 may be considered to correspond to the programmable logic state circuit 1140 since the programmable logic state circuits 1140 and 1225 selectively receive the input signals associated with the input vector $X_{N-1}$.

Figure 13:
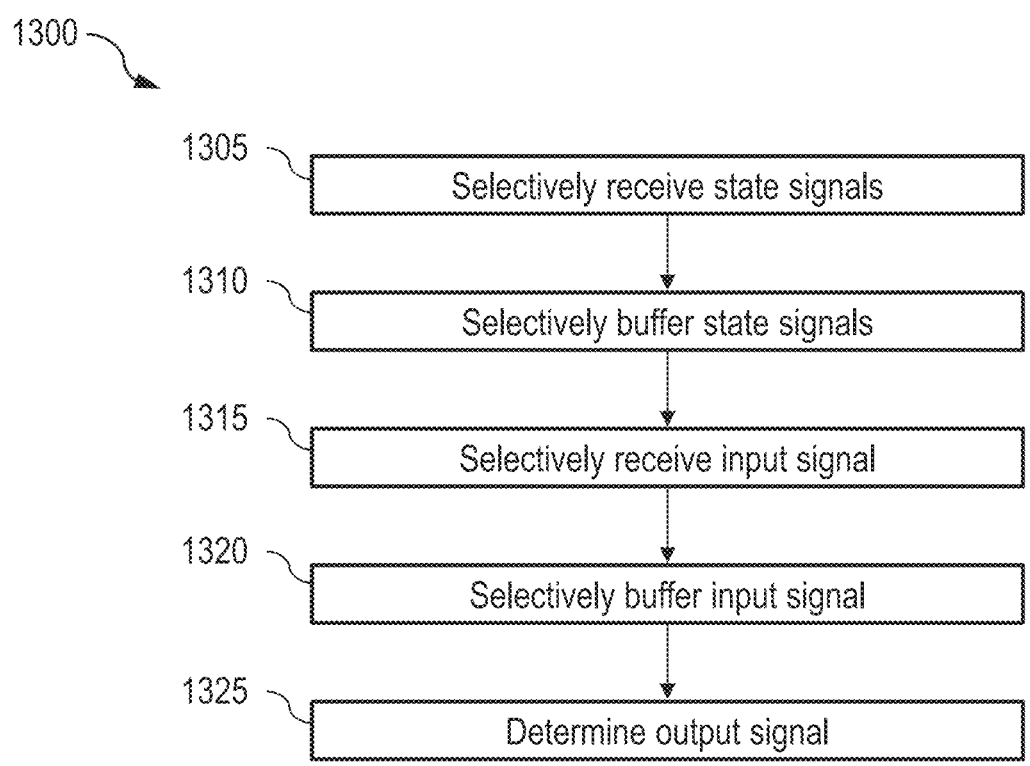
FIG. 13 illustrates a flow diagram of an example process for operating a linear-feedback shift register in accordance with an embodiment of the disclosure.

FIG. 13 illustrates a flow diagram of an example process 1300 for operating an LFSR (e.g., a stage of an LFSR) in accordance with an embodiment of the disclosure. For explanatory purposes, the example process 1300 is described herein with reference to the LFSR circuit 800 of FIG. 8, although the example process 1300 may be utilized with other LFSR circuits. Note that one or more operations may be combined, omitted, and/or performed in a different order as desired.

At block 1305, a set of state signals (e.g., $f_0(n+2)$, $f_1(n+2)$, $f_2(n+2)$) may be selectively received by the LFSR circuit 800 (e.g., the pipeline elements 705, 710, and 715 of the LFSR circuit 800). At block 1310, the set of state signals may be stored (e.g., buffered) by the LFSR circuit 800 to obtain a set of buffered state signals. At block 1315, an input signal (e.g., $x(n+2)$) may be selectively received by the LFSR circuit 800 (e.g., the latency balance element 725A of the LFSR circuit 800). At block 1320, the input signal may be stored (e.g., buffered) by the LFSR circuit 800 (e.g., by the latency balance element 725A) to obtain a buffered input signal. At block 1325, an output signal (e.g., $y_{type2}(n+2)$) may be determined based on the set of buffered state signals and the buffered input signal. Dependent on application, the output signal may represent scrambled or descrambled data (e.g., scrambled or descrambled bit), encrypted or decrypted data, and so forth. In some cases, the output signal may be a type 1 output signal that may be provided to a conversion logic circuit (e.g., 600) for conversion to a type 2 output signal. In some cases, at least one of the buffered state signals may be provided as a feedback signal (e.g., to the state storage elements 405, 410, and/or 415 of the LFSR circuit 800).

It is noted that the process 1300 is described with respect to a portion of the LFSR circuit 800. Other portions (e.g., programmable logic stage circuit) of the LFSR circuit may be associated with a respective set of state signals, a respective input signal, a respective output signal, respective pipeline stages, and respective latency balancing).

While the foregoing describes pipeline stages and associated latency balancing in relation to type 1 LFSR circuits, pipeline stages and associated latency balancing may be inserted in type 2 LFSR circuits. The foregoing describes various LFSR circuits having a type 1 LFSR architecture or a type 2 LFSR architecture and provide equivalences between the type 1 and type 2 LFSR architectures. In various embodiments, equivalences may be provided between next-state equations and output equations between the type 1 and type 2 LFSR architectures, which are described with respect to FIGS. 14-19 below. As an example, the output conversion logic circuit 600 for converting from type 1 outputs to type 2 outputs may be determined based on such equivalences between the type 1 and type 2 LFSR architectures. In various embodiments, establishment of such equivalences may facilitate high-speed parallel implementations through generation of type 1 outputs or type 2 outputs as appropriate for a given application.

In some embodiments, as described with respect to FIG. 14 below, a next-state vector $[F(n+1)]$ and an output signal $y_{type1}(n)$ for a general LFSR circuit having a type 1 architecture may be provided by:

$$[F(n+1)] = [M][F(n)] + [U_0]x(n) = \sum_{k=0}^{n} [M]^{n-k}[U_0]x(k) \quad \text{Equation (1)}$$

$$y_{type1}(n) = [F(n+1)]_{<0>} = \sum_{k=0}^{n} [M]^{n-k}_{<0,0>} x(k) \quad \text{Equation (2)}$$

where $[F(n)]$ is a current-state vector, $x(n)$ is an input signal, $[M]$ is a next-state matrix, and $[U_0]$ is a vector having a value of unity at its zeroth position and zero value at the remaining positions. The notation $<0>$ in the subscript indicates the position of the zeroth element of a vector and $<0,0>$ indicates the position of the zeroth element of a matrix.

Figure 14:
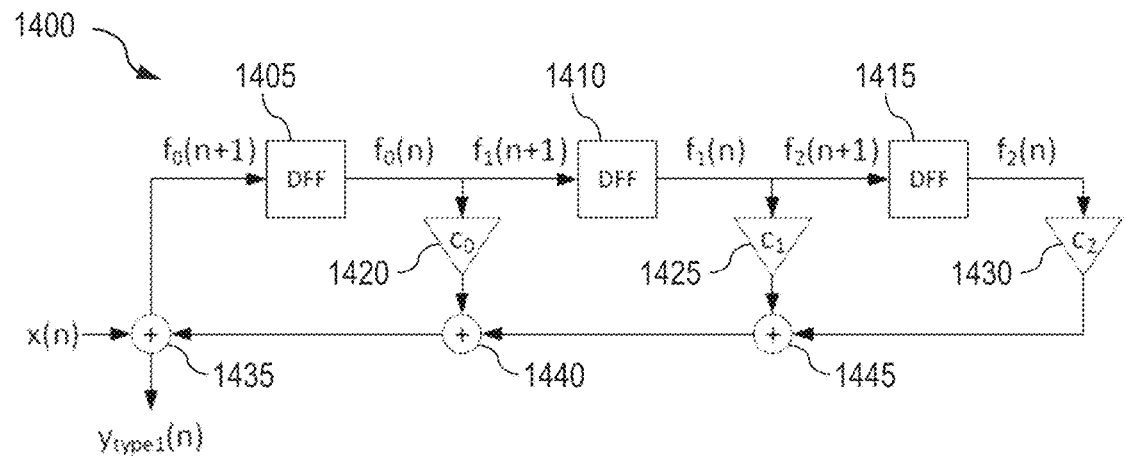
FIG. 14 illustrates a block diagram of a three-tap serial linear-feedback shift register circuit having a type 1 topology.

As an example, FIG. 14 illustrates a block diagram of a three-tap serial LFSR circuit 1400 having a type 1 architecture. In an embodiment, the LFSR circuit 400 of FIG. 4 provides a parallel implementation derived from the three-tap serial LFSR circuit 1400. In this regard, to parallelize the three-tap serial LFSR circuit 1400, the serial implementation may be unrolled and its logic replicated to obtain the LFSR circuit 400. The three-tap serial LFSR circuit 1400 includes state storage elements 1405, 1410, and 1415, programmable multipliers 1420, 1425, and 1430, and programmable combiners 1435, 1440, and 1445.

The state storage element 1405 is connected to the state storage element 1410 and selectively connected to the multiplier 1420. The state storage element 1410 is connected to the state storage element 1415 and selectively connected to the multiplier 1425. The state storage element 1415 is selectively connected to the multiplier 1430. The state storage element 1405 receives as its input a state signal $f_0(n+1)$ and provides as its output a state signal $f_0(n)$. The state storage element 1410 receives as its input a state signal $f_1(n+1)$ and provides as its output a state signal $f_1(n)$. The state storage element 1415 receives as its input a state signal $f_2(n+1)$ and provides as its output a state signal $f_2(n)$. The multiplier 1420 is selectively connected to the combiner 1440. The multipliers 1425 and 1430 are selectively connected to the combiner 1445. The combiner 1445 is selectively connected to the combiner 1440. The combiner 1440 is selectively connected to the combiner 1435. The combiner 1445 selectively receives as inputs $c_1 f_1(n)$ from the multiplier 1425 and $c_2 f_2(n)$ from the multiplier 1430 and generates/provides an output based on these inputs. The combiner 1440 selectively connects to the combiner 1435. The combiner 1440 selectively receives as inputs $c_0 f_0(n)$ from the multiplier 1420 and the output of the combiner 1445 and generates/provides an output based on these inputs. The combiner 1435 selectively receives the input signal $x(n)$ and the output of the combiner 1435 and generates/provides the state signal $f_0(n+1)$ and the output signal $y_{type1}(n)$ as outputs. In an aspect, since the combiners 1435, 1440, and 1445 are provided in a feedback path (e.g., external to a path formed of the state storage elements 1405, 1410, and 1415), the type 1 architecture may be referred to as an external logic LFSR architecture.

A state vector for the three-tap serial LFSR circuit 1400 may be denoted as $[f_0(n) \; f_1(n) \; f_2(n)]^T$, which may be more simply written as $[f_0 \; f_1 \; f_2]^T(n)$. A next-state vector formed of a system of next-state equations $f_0(n+1)$, $f_1(n+1)$, and $f_2(n+1)$ for the three-tap serial LFSR circuit 1400 may be provided by:

$$\begin{bmatrix} f_0 \\ f_1 \\ f_2 \end{bmatrix}(n+1) = \begin{bmatrix} c_0 & c_1 & c_2 \\ 1 & 0 & 0 \\ 0 & 1 & 0 \end{bmatrix} \begin{bmatrix} f_0 \\ f_1 \\ f_2 \end{bmatrix}(n) + \begin{bmatrix} 1 \\ 0 \\ 0 \end{bmatrix} x(n)$$

An output equation for the three-tap serial LFSR circuit 1400 may be provided by:

$$y_{type1}(n) = f_0(n+1)$$

For the three-tap serial LFSR circuit 1400, $[M]$ is provided by:

$$[M] = \begin{bmatrix} c_0 & c_1 & c_2 \\ 1 & 0 & 0 \\ 0 & 1 & 0 \end{bmatrix}$$

Equations (1) and (2) may be developed for a type 1 LFSR circuit using the three-tap serial LFSR circuit 1400 as an example. The initial condition may be set as:

$$\begin{bmatrix} f_0 \\ f_1 \\ f_2 \end{bmatrix}(0) = \begin{bmatrix} 0 \\ 0 \\ 0 \end{bmatrix}$$

A first few terms of the next-state vector of may be provided as follows to determine a general formula for the next-state vector. For n=0:

$$\begin{bmatrix} f_0 \\ f_1 \\ f_2 \end{bmatrix}(1) = \begin{bmatrix} 1 \\ 0 \\ 0 \end{bmatrix} x(0)$$

For $n = 1$:

$$\begin{bmatrix} f_0 \\ f_1 \\ f_2 \end{bmatrix}(2) = \begin{bmatrix} c_0 & c_1 & c_2 \\ 1 & 0 & 0 \\ 0 & 1 & 0 \end{bmatrix} \begin{bmatrix} 1 \\ 0 \\ 0 \end{bmatrix} x(0) + \begin{bmatrix} 1 \\ 0 \\ 0 \end{bmatrix} x(1)$$

For $n = 2$:

$$\begin{bmatrix} f_0 \\ f_1 \\ f_2 \end{bmatrix}(3) = \begin{bmatrix} c_0 & c_1 & c_2 \\ 1 & 0 & 0 \\ 0 & 1 & 0 \end{bmatrix}^2 \begin{bmatrix} 1 \\ 0 \\ 0 \end{bmatrix} x(0) + \begin{bmatrix} c_0 & c_1 & c_2 \\ 1 & 0 & 0 \\ 0 & 1 & 0 \end{bmatrix} \begin{bmatrix} 1 \\ 0 \\ 0 \end{bmatrix} x(1) + \begin{bmatrix} 1 \\ 0 \\ 0 \end{bmatrix} x(2)$$

For $n = 3$:

$$\begin{bmatrix} f_0 \\ f_1 \\ f_2 \end{bmatrix}(4) = \begin{bmatrix} c_0 & c_1 & c_2 \\ 1 & 0 & 0 \\ 0 & 1 & 0 \end{bmatrix}^3 \begin{bmatrix} 1 \\ 0 \\ 0 \end{bmatrix} x(0) +$$

$$\begin{bmatrix} c_0 & c_1 & c_2 \\ 1 & 0 & 0 \\ 0 & 1 & 0 \end{bmatrix}^2 \begin{bmatrix} 1 \\ 0 \\ 0 \end{bmatrix} x(1) + \begin{bmatrix} c_0 & c_1 & c_2 \\ 1 & 0 & 0 \\ 0 & 1 & 0 \end{bmatrix} \begin{bmatrix} 1 \\ 0 \\ 0 \end{bmatrix} x(2) + \begin{bmatrix} 1 \\ 0 \\ 0 \end{bmatrix} x(3)$$

For a given time unit n, the next-state vector may be provided by:

$$\begin{bmatrix} f_0 \\ f_1 \\ f_2 \end{bmatrix}(n+1) = \sum_{k=0}^{n} \begin{bmatrix} c_0 & c_1 & c_2 \\ 1 & 0 & 0 \\ 0 & 1 & 0 \end{bmatrix}^{n-k} \begin{bmatrix} 1 \\ 0 \\ 0 \end{bmatrix} x(k) \quad \text{Equation (3)}$$

To arrive at Equation (1) for the next-state vector for the general LFSR circuit (e.g., number of taps may be fewer or higher than three), the specific next-state matrix of Equation (3) may be replaced with [M] and the $[1\ 0\ 0]^T$ of Equation (3) may be replaced with $[U_0]$. Equation (2) for characterizing the primary output $y_{type1}(n)$ follows from Equation (1). As shown in Equations (1)-(3), such computations may involve multiplication of the next-state matrix with itself multiple times.

A principle of complete induction may be used to prove the general formula set forth in Equation (1). In this regard, if the general formula is true for [F(n+1)], then under the principle of complete induction the general formula is also true for [F(n+2)].

$$[F(n+1)] = [M][F(n)] + [U_0]x(n) = \sum_{k=0}^{n}[M]^{n-k}[U_0]x(k)$$

$$[F(n+2)] = [M][F(n+1)] + [U_0]x(n+1) =$$

-continued $$\sum_{k=0}^{n}[M]^{n+1-k}[U_0]x(k) + [U_0]x(n+1) = \sum_{k=0}^{n+1}[M]^{n-k}[U_0]x(k)$$

Accordingly, Equation (1) and (2) provide the next-state vector (e.g., next-state system of equations) and the output equation, respectively, that characterize the three-tap serial LFSR circuit 1400. Equations (1) and (2) relate to matrix multiplications of the next-state matrix with itself multiple times. For any given LFSR circuit, Equations (1) and (2), and other equations provided above, may be simplified in implementations in which one or more of the coefficients $c_0$, $c_1$, or $c_2$ are zero (e.g., in which associated multipliers and/or combiners are disabled). The LFSR circuit 1400 implements a programmable generator polynomial $c_2x^2+c_1x^1+c_0$. As an example, to implement a generator polynomial $x^2+1$, the coefficients may be programmed to $c_2=c_0=1$ and $c_1=0$, in which the multiplier 1425, the combiner 1445, and associated routing resources (e.g., represented by downward pointing arrows at the input and output of the multiplier 1425) may be disabled.

In some embodiments, as described with respect to FIG. 15 below, a next-state vector [G(n+1)] and an output equation $y_{type2}(n)$ for a general LFSR circuit having a type 2 architecture are provided by:

$$[G(n+1)] = [M^T][G(n)] + [U_0]x(n) = \sum_{k=0}^{n}[M^T]^{n-k}[U_0]x(k) \quad \text{Equation (4)}$$

$$y_{type2}(n+1) = [G(n+1)]_{<0>} = \sum_{k=0}^{n}[M^T]^{n-k}_{<0,0>}x(k) \quad \text{Equation (5)}$$

where [M] is the next-state matrix associated with the type 1 architecture and $[M^T]$ is a state transition matrix associated with the type 2 architecture and obtained by transposing [M] as further described herein.

Figure 15:
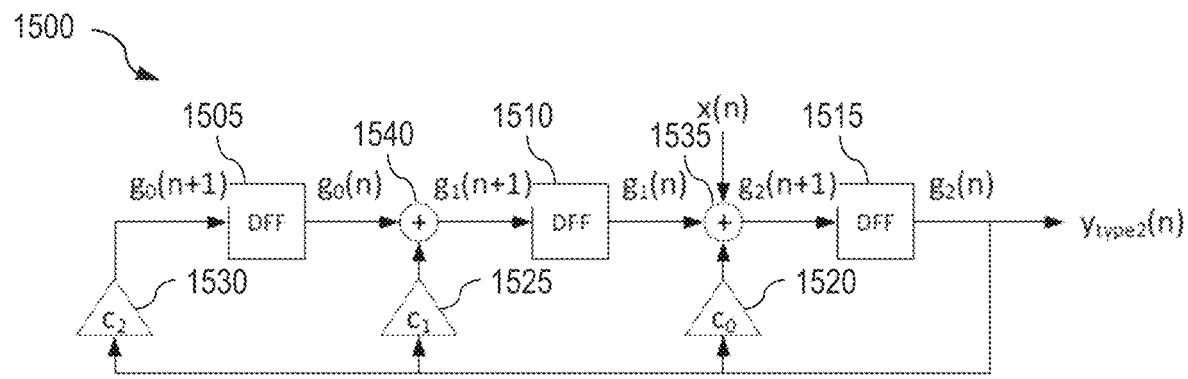
FIG. 15 illustrates a block diagram of a three-tap serial linear-feedback shift register circuit having a type 2 topology.

As an example, FIG. 15 illustrates a block diagram of a three-tap serial LFSR circuit 1500 having a type 2 architecture. The three-tap serial LFSR circuit 1500 corresponds to and may be considered equivalent to the three-tap serial LFSR circuit 1400 of FIG. 14, which has a type 1 architecture. The three-tap serial LFSR 1500 includes state storage elements 1505, 1510, and 1515, programmable multipliers 1520, 1525, and 1530, and programmable combiners 1535 and 1540.

The state storage element 1505 is selectively connected to the combiner 1540. The combiner 1540 is selectively connected to the state storage element 1510. The state storage element 1510 is electively connected to the combiner 1535. The combiner 1535 is selectively connected to the state storage element 1515. The state storage element 1515 is selectively connected to the multipliers 1520, 1525, and 1530. The multiplier 1520 is selectively connected to the combiner 1535. The multiplier 1525 is selectively connected to the combiner 1540. The multiplier 1530 is selectively connected to the state storage element 1505. The state storage element 1505 receives as its input a state signal $g_0(n+1)$ and provides as its output a state signal $g_0(n)$. The state storage element 1510 receives as its input a state signal $g_1(n+1)$ and provides as its output a state signal $g_1(n)$. The state storage element 1515 receives as its input a state signal $g_2(n+1)$ and provides as its output a state signal $g_2(n)$. The combiner 1540 selectively receives as inputs $c_1g_2(n)$ from the multiplier 1525 and the state signal $g_0(n)$ from the state storage element 1505 and generates/provides the state signal $g_1(n+1)$ based on these inputs. The combiner 1535 selectively receives as inputs $c_0g_2(n)$ from the multiplier 1520, the state signal $g_1(n)$, and the input signal $x(n)$ and generates/provides the state signal $g_2(n)$ based on these inputs. In an aspect, since the combiners 1535 and 1540 are provided in-line with a path formed of the state storage elements 1505, 1510, and 1515, the type 2 architecture may also be referred to as an internal logic LFSR architecture.

A state vector for the three-tap serial LFSR circuit 1500 may be denoted as $[g_0(n)\ g_1(n)\ g_2(n)]^T$. A next-state vector formed of a system of next-state equations $g_0(n+1)$, $g_1(n+1)$, and $g_2(n+1)$ for the three-tap serial LFSR circuit 1500 may be provided by:

$$\begin{bmatrix}g_0\\g_1\\g_2\end{bmatrix}(n+1) = \begin{bmatrix}c_0 & 1 & 0\\c_1 & 0 & 1\\c_2 & 0 & 0\end{bmatrix}\begin{bmatrix}g_0\\g_1\\g_2\end{bmatrix}(n) + \begin{bmatrix}1\\0\\0\end{bmatrix}x(n)$$

An output equation for the three-tap serial LFSR circuit 1500 may be provided by:

$$y_{type2}(n+1)=g_2(n+1)$$

For the three-tap serial LFSR circuit 1500, $[M^T]$ is provided by:

$$[M^T] = \begin{bmatrix}c_0 & 1 & 0\\c_1 & 0 & 1\\c_2 & 0 & 0\end{bmatrix}$$

in which the first column is non-trivial and the remaining columns are trivial.

Equations (4) and (5) may be developed for a type 1 LFSR circuit using the three-tap serial LFSR circuit 1500 as an example. The initial condition may be set as:

$$\begin{bmatrix}g_0\\g_1\\g_2\end{bmatrix}(0) = \begin{bmatrix}0\\0\\0\end{bmatrix}$$

A first few terms of the next-state vector of may be provided as follows to determine a general formula for the next-state vector. For n=0:

$$\begin{bmatrix}g_0\\g_1\\g_2\end{bmatrix}(1) = \begin{bmatrix}1\\0\\0\end{bmatrix}x(0)$$

For $n = 1$:

$$\begin{bmatrix}g_0\\g_1\\g_2\end{bmatrix}(2) = \begin{bmatrix}c_0 & 1 & 0\\c_1 & 0 & 1\\c_2 & 0 & 0\end{bmatrix}\begin{bmatrix}1\\0\\0\end{bmatrix}x(0) + \begin{bmatrix}1\\0\\0\end{bmatrix}x(1)$$

For $n = 2$:

$$\begin{bmatrix}g_0\\g_1\\g_2\end{bmatrix}(3) = \begin{bmatrix}c_0 & 1 & 0\\c_1 & 0 & 1\\c_2 & 0 & 0\end{bmatrix}^2\begin{bmatrix}1\\0\\0\end{bmatrix}x(0) + \begin{bmatrix}c_0 & 1 & 0\\c_1 & 0 & 1\\c_2 & 0 & 0\end{bmatrix}\begin{bmatrix}1\\0\\0\end{bmatrix}x(1) + \begin{bmatrix}1\\0\\0\end{bmatrix}x(2)$$

For $n = 3$:

$$\begin{bmatrix}g_0\\g_1\\g_2\end{bmatrix}(4) =$$

$$\begin{bmatrix}c_0 & 1 & 0\\c_1 & 0 & 1\\c_2 & 0 & 0\end{bmatrix}^3\begin{bmatrix}1\\0\\0\end{bmatrix}x(0) + \begin{bmatrix}c_0 & 1 & 0\\c_1 & 0 & 1\\c_2 & 0 & 0\end{bmatrix}^2\begin{bmatrix}1\\0\\0\end{bmatrix}x(1) + \begin{bmatrix}c_0 & 1 & 0\\c_1 & 0 & 1\\c_2 & 0 & 0\end{bmatrix}\begin{bmatrix}1\\0\\0\end{bmatrix}x(2) + \begin{bmatrix}1\\0\\0\end{bmatrix}x(3)$$

For a given time instance n, the next-state vector may be provided by:

$$\begin{bmatrix}g_0\\g_1\\g_2\end{bmatrix}(n+1) = \sum_{k=0}^{n}\begin{bmatrix}c_0 & 1 & 0\\c_1 & 0 & 1\\c_2 & 0 & 0\end{bmatrix}^{n-k}\begin{bmatrix}1\\0\\0\end{bmatrix}x(k) \qquad \text{Equation (6)}$$

To arrive at Equation (4) for the next-state vector for the general LFSR circuit (e.g., number of taps may be fewer or higher than three), the specific next-state matrix of Equation (6) may be replaced with $[M^T]$ (e.g., transposed relative to the corresponding next-state matrix for the type 1 architecture) and the $[1\ 0\ 0]^T$ of Equation (6) may be replaced with $[U_0]$. Equation (5) for characterizing the primary output $y_{type2}(n+1)$ follows from Equation (5). As shown in Equations (4)-(6), such computations may involve multiplication of the next-state matrix with itself multiple times.

The principle of complete induction may be used to prove the general formula set forth in Equation (4). In this regard, if the general formula is true for $[G(n+1)]$, then under the principle of complete induction the general formula is also true for $[G(n+2)]$.

$$[G(n+1)] = [M^T][G(n)] + [U_0]x(n) = \sum_{k=0}^{n}[M^T]^{n-k}[U_0]x(k)$$

$$[G(n+2)] = [M^T][G(n+1)] + [U_0]x(n+1) =$$

$$\sum_{k=0}^{n}[M^T]^{n-k}[U_0]x(k) + [U_0]x(n+1) = \sum_{k=0}^{n+1}[M]^{n+1-k}[U_0]x(k)$$

Equivalence may be shown between output signals of the type 1 LFSR architecture and the type 2 LFSR architecture. Such an equivalence provides output conversion from type 1 outputs to type 2 outputs, or vice versa, and allows for embodiments in which the type 1 LFSR architecture is used (e.g., to leverage lower chip area and/or better timing performance generally associated with the type 1 LFSR architecture) and selectively converting outputs of the type 1 LFSR architecture to outputs of the type 2 LFSR architecture if desired for an application.

Equivalence may be shown between Equations (2) and (5). In this regard, such an equivalence is for a case in which a data entry point is in front of a first state storage element for type 1 (e.g., the state storage element 1505) and in front of a last state storage element for type 2 (e.g., the state storage element 1515). A matrix transposed and then raised to the power of a natural number is identical to the matrix raised to the power of the natural number and then transposed:

$$[M^T]^{n-k} = [M]^{n-k^T}$$

The element at location <0,0> of either matrix is the same because this location is invariant to transposition:

$$[M]^T{}_{<0,0>}{}^{n-k} = [M]_{<0,0>}{}^{n-k^T} = [M]_{<0,0>}{}^{n-k}$$

As such, the following equivalence is shown between the type 1 output and the type 2 output:

$$y_{type1}(n) = \sum_{k=0}^{n}[M]_{<0,0>}^{n-k}x(k) = \sum_{k=0}^{n}\left[M^T\right]_{<0,0>}^{n-k}x(k) = y_{type2}(n+1) \quad \text{Equation (7)}$$

A general type 2 LFSR architecture may have data entry points in front of each state storage element (e.g., such as for CRC or FEC calculation). For example, a type 2 LFSR for FEC decoding has data entry points specified by a remainder of a polynomial division. A type 1 architecture corresponding to the general type 2 LFSR architecture and associated equivalence between type 1 outputs and type 2 outputs are provided below.

Figure 16:
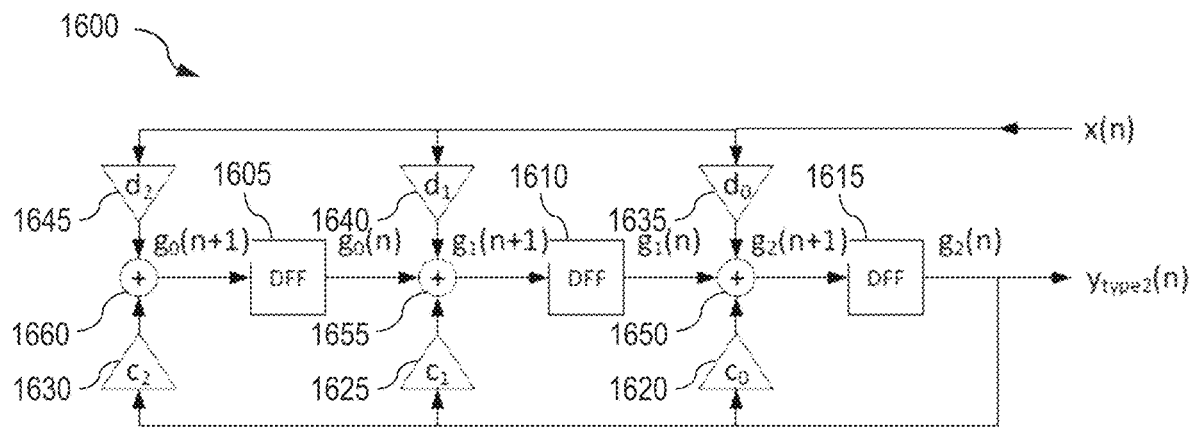
FIG. 16 illustrates a block diagram of a three-tap serial linear-feedback shift register circuit having a type 2 topology.

As an example, FIG. 16 illustrates a block diagram of a three-tap serial LFSR circuit 1600 having such a general type 2 architecture. The three-tap serial LFSR 1600 includes state storage elements 1606, 1610, and 1615, programmable multipliers 1620, 1625, 1630, 1635, 1640, and 1645, and programmable combiners 1650, 1655, and 1660.

The combiner 1660 is selectively connected to the state storage element 1605. The state storage element 1605 is selectively connected to the combiner 1655. The combiner 1655 is selectively connected to the state storage element 1610. The state storage element 1610 is electively connected to the combiner 1650. The combiner 1650 is selectively connected to the state storage element 1615. The multipliers 1620, 1625, and 1630 are selectively connected to the combiners 1650, 1655, and 1660, respectively. The multipliers 1635, 1640, and 1645 are selectively connected to the combiners 1650, 1655, and 1660, respectively.

The state storage element 1605 receives as its input a state signal $g_0(n+1)$ and provides as its output a state signal $g_0(n)$. The state storage element 1610 receives as its input a state signal $g_1(n+1)$ and provides as its output a state signal $g_1(n)$. The state storage element 1615 receives as its input a state signal $g_2(n+1)$ and provides as its output a state signal $g_2(n)$. The combiner 1650 selectively receives as inputs $c_0 g_2(n)$ from the multiplier 1620, $d_0 x(n)$ from the multiplier 1635, and the state signal $g_1(n)$ from the state storage element 1610 and generates/provides the state signal $g_2(n+1)$ based on these inputs. The combiner 1655 selectively receives as inputs $c_1 g_2(n)$ from the multiplier 1625, $d_1 x(n)$ from the multiplier 1640, and the state signal $g_0(n)$ from the state storage element 1605 and generates/provides the state signal $g_1(n+1)$ based on these inputs. The combiner 1660 selectively receives as inputs $c_2 g_2(n)$ from the multiplier 1630 and $d_2 x(n)$ from the multiplier 1645.

A programmable generator polynomial may be provided as $c_2 x^2 + c_1 x + c_0$. A data entry polynomial may be provided as $d_2 x^2 + d_1 x + d_0$. A state vector for the three-tap serial LFSR circuit 1600 may be denoted as $[g_0(n)\ g_1(n)\ g_2(n)]$. A next-state vector formed of a system of next-state equations $g_0(n+1)$, $(n+1)$, and $g_2(n+1)$ for the three-tap serial LFSR circuit 1600 may be provided by:

$$\begin{bmatrix} g_0 \\ g_1 \\ g_2 \end{bmatrix}(n+1) = \begin{bmatrix} c_0 & 1 & 0 \\ c_1 & 0 & 1 \\ c_2 & 0 & 0 \end{bmatrix}\begin{bmatrix} g_0 \\ g_1 \\ g_2 \end{bmatrix}(n) + \begin{bmatrix} d_0 \\ d_1 \\ d_2 \end{bmatrix}x(n)$$

in which the data entry vector $[d_0\ d_1\ d_2]^T$ may be expanded:

$$\begin{bmatrix} g_0 \\ g_1 \\ g_2 \end{bmatrix}(n+1) = \begin{bmatrix} c_0 & 1 & 0 \\ c_1 & 0 & 1 \\ c_2 & 0 & 0 \end{bmatrix}\begin{bmatrix} g_0 \\ g_1 \\ g_2 \end{bmatrix}(n) + \left(\begin{bmatrix} d_0 \\ 0 \\ 0 \end{bmatrix} + \begin{bmatrix} 0 \\ d_1 \\ 0 \end{bmatrix} + \begin{bmatrix} 0 \\ 0 \\ d_2 \end{bmatrix}\right)x(n)$$

In this regard, the data entry vector $[d_0\ d_1\ d_2]^T$ is generalized compared to the data entry vector $[1\ 0\ 0]^T$ described with respect to the three-tap serial LFSR circuit 1500 of FIG. 15.

For a given time instance n, the next-state vector for the three-tap serial LFSR circuit 1600 may be provided as:

$$\begin{bmatrix} g_0 \\ g_1 \\ g_2 \end{bmatrix}(n+1) = \sum_{k=0}^{n}\begin{bmatrix} c_0 & 1 & 0 \\ c_1 & 0 & 1 \\ c_2 & 0 & 0 \end{bmatrix}^{n-k}\left(\begin{bmatrix} d_0 \\ 0 \\ 0 \end{bmatrix} + \begin{bmatrix} 0 \\ d_1 \\ 0 \end{bmatrix} + \begin{bmatrix} 0 \\ 0 \\ d_2 \end{bmatrix}\right)x(k)$$

For a general next-state matrix $[M^T]$ and data entry vector $[D]$ (associated with a data entry polynomial), a next-state vector may be provided by:

$$[G(n+1)] = [M^T][G(n)] + [D]x(n)$$

which may be expanded as follows:

$$[G(n+1)] = [M^T][G(n)] + [D]x(n) = [M^T][G(n)] + \sum_{i=0}^{m-1}[U_i]d_i x(n) = \sum_{k=0}^{n}[M^T]^{n-k}\sum_{i=0}^{m-1}[U_i]d_i x(n) \quad \text{Equation (8)}$$

where m denotes the rank of the transposed matrix $[M^T]$.

Equation (8) represents a superposition of multiple terms representing different values of i. As provided above with respect to Equation (7), the solution for i=0 is known. The solution for i>0 is given by $[M^T]^{n-k}[U_i]$, which column number i of the matrix $[M^T]^{n-k}$. Each such matrix is a product of a previous matrix $[M^T]^{n-1-k}$ with $[M^T]$ (i.e., $[M^T]^{n-k}=[M^T]^{n-1-k}[M^T]$).

The state transition matrix $[M^T]$ may be provided by:

$$[M^T] = \begin{bmatrix} c_0 & 1 & 0 & \ldots & 0 & 0 \\ c_1 & 0 & 1 & \ldots & 0 & 0 \\ \vdots & 0 & 0 & \ldots & 1 & 0 \\ c_{m-2} & 0 & 0 & \ldots & 0 & 1 \\ c_{m-1} & 0 & 0 & \ldots & 0 & 0 \end{bmatrix}$$

The first column of the state transition matrix $[M^T]$ is provided by the vector of polynomial coefficients:

$$[C] = \begin{bmatrix} c_0 \\ c_1 \\ \vdots \\ c_{m-2} \\ c_{m-1} \end{bmatrix}$$

The remainder of the state transition matrix $[M^T]$ is provided by a shifted unity matrix:

$$\begin{bmatrix} 1 & 0 & \ldots & 0 & 0 \\ 0 & 1 & \ldots & 0 & 0 \\ 0 & 0 & \ldots & 1 & 0 \\ 0 & 0 & \ldots & 0 & 1 \\ 0 & 0 & \ldots & 0 & 0 \end{bmatrix}$$

In this regard, the product of an arbitrary matrix $[M^T]^{n-1-k}$ with $[M^T]$ has a column number i of the arbitrary matrix shifted to the right. In other words, column number i+1 of the product $[M^T]^{n-k}=[M^T]^{n-1-k[M^T]}$ is the same as column number i of $[M^T]$:

$$\begin{bmatrix} e_{0,0} & e_{0,1} & \cdots & e_{0,i} & \cdots & e_{0,m-2} & e_{0,m-1} \\ e_{1,0} & e_{1,1} & \cdots & e_{1,i} & \cdots & e_{1,m-2} & e_{1,m-1} \\ \vdots & \vdots & \ddots & \vdots & \vdots & \vdots & \vdots \\ e_{m-2,0} & e_{m-2,1} & \cdots & e_{m-2,i} & \cdots & e_{m-2,m-2} & e_{m-2,m-1} \\ e_{m-1,0} & e_{m-1,1} & \cdots & e_{m-1,i} & \cdots & e_{m-1,m-2} & e_{m-1,m-1} \end{bmatrix}$$

$$\begin{bmatrix} c_0 & 1 & 0 & \cdots & 0 & 0 \\ c_1 & 0 & 1 & \cdots & 0 & 0 \\ \vdots & 0 & 0 & \cdots & 1 & 0 \\ c_{m-2} & 0 & 0 & \cdots & 0 & 1 \\ c_{m-1} & 0 & 0 & \cdots & 0 & 0 \end{bmatrix} = \begin{bmatrix} ? & e_{0,0} & e_{0,1} & \cdots & e_{0,i} & \cdots & e_{0,m-2} \\ ? & e_{1,0} & e_{1,1} & \cdots & e_{1,i} & \cdots & e_{1,m-2} \\ ? & \vdots & \vdots & \ddots & \vdots & \vdots & \vdots \\ ? & e_{m-2,0} & e_{m-2,1} & \cdots & e_{m-2,i} & \cdots & e_{m-2,m-2} \\ ? & e_{m-1,0} & e_{m-1,1} & \cdots & e_{m-1,i} & \cdots & e_{m-1,m-2} \end{bmatrix}$$

The equivalence for i=0 is provided above:

$$y_{type2}(n+1)_{i=0} = \sum_{k=0}^{n} [M^T]^{n-k}_{<0,i=0>} x(k) = \sum_{k=0}^{n} [M]^{n-k}_{<0,i=0>} x(k) = y_{type1}(n)$$

At $i = 1$:

$$y_{type2}(n+1)_{i=1} = \sum_{k=0}^{n} [M^T]^{n-k}_{<0,i=1>} x(k) = \sum_{k=0}^{n-1} [M^T]^{n-k}_{<0,i=0>} x(k) + [M^T]^{0}_{<0,i=1>} x(n)$$

The last term evaluates to zero, because $[M^T]^0$ is the unity matrix, and, as such, all elements except on the main diagonal are zero:

$$y_{type2}(n+1)_{i=1} = \sum_{k=0}^{n-1} [M^T]^{n-k}_{<0,i=1>} x(k)$$

Due to the shift-right property of the matrix column, this equation may be provided as:

$$y_{type2}(n+1)_{i=1} = \sum_{k=0}^{n-1} [M^T]^{n-k}_{<0,i=1>} x(k) = \sum_{k=0}^{n-1} [M^T]^{n-1-k}_{<0,i=0>} x(k)$$

This happens to be the same as the output of the corresponding type 1 output at one time unit prior:

$$y_{type2}(n+1)_{i=1} = \sum_{k=0}^{n-1} [M^T]^{n-1-k}_{<0,i=0>} x(k) = \sum_{k=0}^{n-1} [M]^{n-1-k}_{<0,i=0>} x(k) = y_{type1}(n-1)$$

Similarly, the type 2 output for any data entry point $0 \leq i \leq m-1$ corresponds to the type 1 output i time units prior:

$$y_{type2}(n+1)_i = \sum_{k=0}^{n-i} [M^T]^{n-i-k}_{<0,i>} x(k) = \sum_{k=0}^{n-i} [M]^{n-i-k}_{<0,0>} x(k) = y_{type1}(n-i)$$

Having determined a partial solution for each i, a compute solution may be determined. In this regard, the complete solution may be provided as a sum of each partial solution according to the superposition principle:

$$y_{type2}(n+1) = \sum_{i=0}^{m-1} d_i y_{type1}(n-i)$$

Subsequent outputs of a type 1 LFSR circuit may be the same as an internal state of the LFSR circuit. This formula represents the scalar product of the data entry polynomial vector and the internal state vector.

Figure 17:
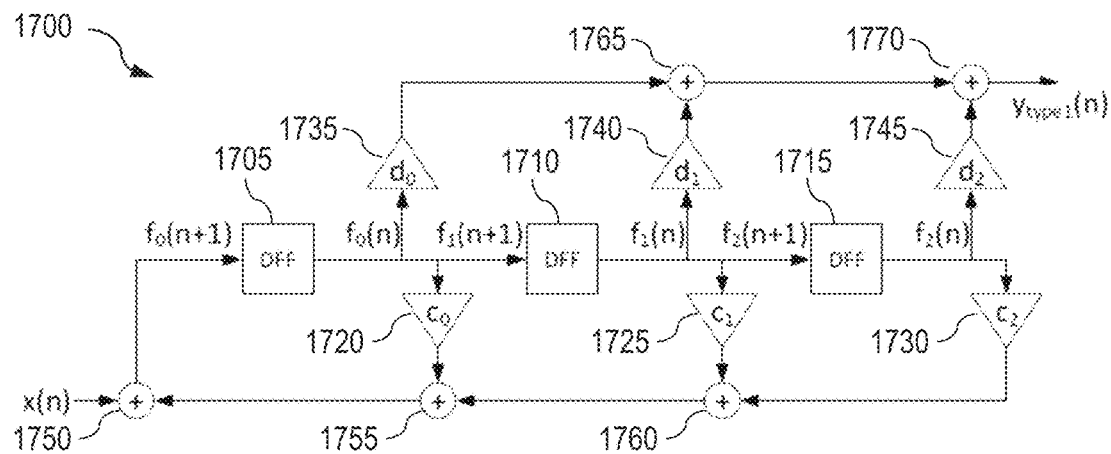
FIG. 17 illustrates a block diagram of a three-tap serial linear-feedback shift register circuit having a type 1 topology.

With such an equivalence determined between the type 2 LFSR output and the type 1 LFSR output, an equivalent type 1 LFSR circuit may be provided for a type 2 LFSR circuit. As an example, FIG. 17 illustrates a block diagram of a three-tap serial LFSR circuit 1700 having a type 1 architecture. In an embodiment, the three-tap serial LFSR circuit 1700 provides additional logic (e.g., relative to the three-tap serial LFSR circuit 1400 of FIG. 14) for output equivalence with the three-tap LFSR circuit 1600.

The three-tap serial LFSR circuit 1700 includes state storage elements 1705, 1710, and 1715, programmable multipliers 1720, 1725, 1730, 1735, 1740, and 1745, and programmable combiners 1750, 1755, 1760, 1765, and 1770. Relative to the three-tap serial LFSR circuit 1600 of FIG. 16, the combiners 1750, 1755, 1760, 1765, and 1770 of the three-tap serial LFSR circuit 1700 of FIG. 17 are provided in feedback and feedforward paths external to a path formed of the state storage elements 1705, 1710, and 1715.

In cases where the vector representing the data entry polynomial is identical to the vector representing the generator polynomial (i.e., $d_i = c_i$), various simplified type 1 LFSR circuits and type 2 LFSR circuits may also be equivalent in terms of their primary output. In some cases, these simplified circuits may not support application of FEC decoders.

Figure 18:
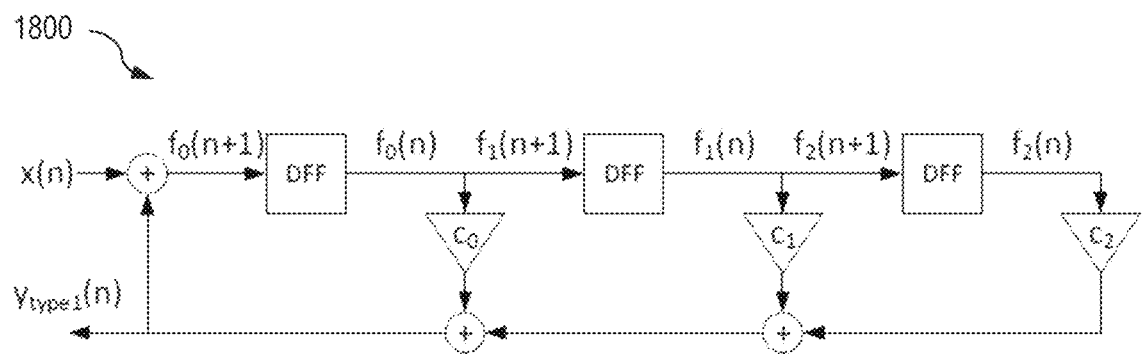
FIG. 18 illustrates a block diagram of a three-tap serial linear-feedback shift register circuit having a type 1 topology.
Figure 19:
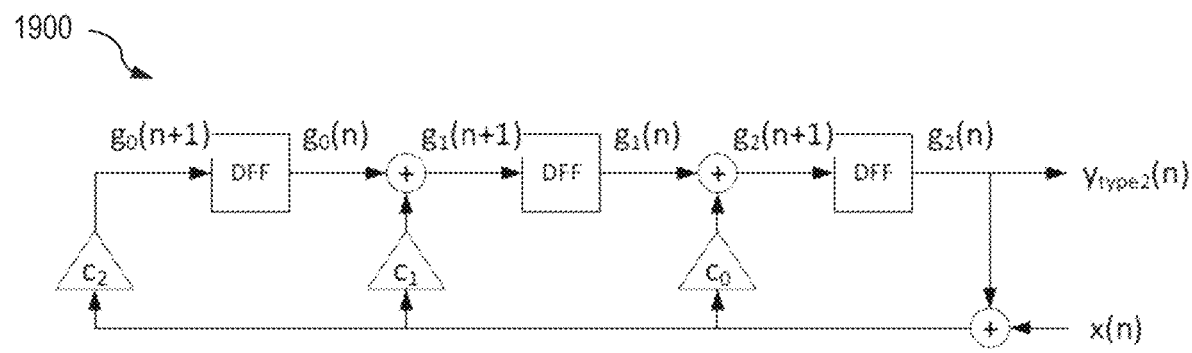
FIG. 19 illustrates a block diagram of a three-tap serial linear-feedback shift register circuit having a type 2 topology.

As examples, FIG. 18 illustrates a block diagram of a three-tap serial LFSR circuit 1800 having a type 1 architecture, and FIG. 19 illustrates a block diagram of a three-tap serial LFSR circuit 1900 having a type 2 architecture. The three-tap serial LFSR circuits 1800 and 1900 may be considered simplified circuits relative to the more general three-tap serial LFSR circuits 1700 and 1600. The three-tap serial LFSR circuits 1800 and 1900 may be shown under certain conditions to be equivalent in terms of their primary output with respect to the more general three-tap serial LFSR circuits 1700 and 1600.

An output equation for the three-tap serial LFSR circuit 1700 of FIG. 17 (e.g., generalized type 1 LFSR output equation) may be provided by:

$$y_{type1}(n) = \begin{bmatrix} d_2 & d_1 & d_0 \end{bmatrix} \begin{bmatrix} f_2 \\ f_1 \\ f_0 \end{bmatrix}(n)$$

An output equation for the three-tap serial LFSR circuit 1800 of FIG. 18 (e.g., simplified type 1 LFSR output equation) may be provided by:

$$y_{type1}(n) = \begin{bmatrix} c_2 & c_1 & c_0 \end{bmatrix} \begin{bmatrix} f_2 \\ f_1 \\ f_0 \end{bmatrix}(n)$$

For $[d_2\ d_1\ d_0] = [c_2\ c_1\ c_0]$, the outputs $y_{type1}(n)$ are identical.

An output equation for the three-tap serial LFSR circuit 1600 of FIG. 16 (e.g., generalized type 2 LFSR output equation) may be provided by:

$$y_{type2}(n+1) = \begin{bmatrix} c_0 & 1 & 0 \end{bmatrix} \begin{bmatrix} g_2 \\ g_1 \\ g_0 \end{bmatrix} (n) + d_0 \cdot x(n)$$

An output equation for the three-tap serial LFSR circuit 1900 of FIG. 19 (e.g., simplified type 2 LFSR output equation) may be provided by:

$$y_{type2}(n+1) = \begin{bmatrix} c_0 & 1 & 0 \end{bmatrix} \begin{bmatrix} g_2 + x \\ g_1 \\ g_0 \end{bmatrix} (n)$$

For $[d_0\ d_1\ d_2] = [c_0\ c_1\ c_2]$, the outputs $y_{type2}(n+1)$ are identical.

In some embodiments, the various equivalences between the type 1 LFSR architecture and the type 2 LFSR architecture shown for example in FIGS. 14-19 allow for conversion from the type 1 LFSR outputs to the type 2 LFSR outputs, or vice versa, such as by using the output conversion logic circuit 600 of FIG. 6.

Using various embodiments, LFSR circuits may be programmed to implement applications generally associated with type 1 LFSR circuitry and/or type 2 LFSR circuitry. Various standards may define a serial implementation of an LFSR which processes one bit of data per clock cycle. In such embodiments, an LFSR circuit for a given application may be specified by its type, generator polynomial, and/or data entry polynomial. Table 1 provides standard LFSR examples that may be implemented using various LFSR circuits provided herein. The examples in Table 1 are not exhaustive, and other applications may also be implemented using various LFSR circuits provided herein.

TABLE 1

Standard LFSR examples

| Standard | Clause | Application | Type | Generator polynomial |
|---|---|---|---|---|
| PCIe Rev 4.0, V1.0 | 2.7.1 and 3.6.2.1 | CRC | 2 | $x^{32} + x^{26} + x^{25} + x^{23} + x^{22} + x^{16} + x^{12} + x^{11} + x^{10} + x^8 + x^7 + x^5 + x^4 + x^2 + x + 1$ |
| | 4.2.1.3 | Scrambler | 1 | $x^{16} + x^5 + x^4 + x^3 + 1$ |
| IEEE 802.3 section 4 | 49.2.6 | Scrambler | 1 | $x^{58} + X^{39} + 1$ |
| | 49.2.8 | PRBS | 1 | $x^{31} + x^{28} + 1$ |
| IEEE 802.3 section 5 | 74.7.4.4 | SC-FEC | 2 | $x^{32} + x^{23} + x^{21} + x^{11} + x^2 + 1$ |
| IEEE 802.3 section 7 | 101.3.2.3 | CRC | 2 | $x^{40} + x^{26} + x^{23} + x^{17} + x^3 + 1$ |
| JESD204C | 7.4.2 | CRC | 2 | $x^{12} + x^9 + x^8 + x^3 + x^2 + x + 1$ |
| JESD204C | 7.5.2 | SC-FEC | 2 | $x^{26} + x^{21} + x^{17} + x^9 + x^4 + 1$ |

Various of the examples provided in Table 1 are discussed herein. As an example application implemented using the type 1 LFSR architecture, IEEE 802.3 Section 4 defines a PRBS pattern generator (e.g., FIG. 49-9 of IEEE 802.3 Section 4) with a generator polynomial $x^{31}+x^{28}+1$ and a corresponding PRBS pattern checker (e.g., FIG. 49-11 of IEEE 802.3 Section 4). The generated pattern is completely defined/specified by its feedback loop and its initial state without an external data input x(n). In this regard, no external data input is needed by the pattern generator to generate a pseudorandom sequence. The pattern checker has a feedforward loop to process the pattern sent from the pattern generator and has no feedback loop. As another example, IEEE 802.3 Section 4 also defines a self-synchronous scrambler (e.g., FIG. 49-8 of IEEE 802.3 Section 4) with a generator polynomial $x^{58}+x^{39}+1$ and a corresponding de-scrambler (e.g., FIG. 49-10 of IEEE 802.3 Section 4). A data input enters at a first state storage element. Similar to the PRBS checker, the de-scrambler has a feedforward loop to process the data sent from the scrambler and has no feedback loop.

As an example application implemented using the type 2 LFSR architecture, PCIe Rev 4.0, V1.0 defines a frame-synchronous scrambler (e.g., FIG. 4-10 of PCI Express Base Specification Rev. 4.0 Version 1.0) with a generator polynomial $x^{16}+x^5+x^4+x^3+1$. Data does not enter the LFSR. The data is combined with an LFSR output by an external XOR gate. A corresponding de-scrambler would be identical to the scrambler. Contrary to the self-synchronous scrambler, the frame-synchronous scrambler needs external synchronization to align the phase of the data with the phase of the LFSR output.

As another example, JESD204C defines a CRC field generator (e.g., FIG. 77 of JESD204C) with a generator polynomial $x^{16}+x^5+x^4+x^3+1$. Data entry points are located at the same places as feedback loops. A receive would employ an identical CRC calculator as a transmitter. Another circuit would compare the transmitted checksum with the re-calculated checksum and determine whether bit transmission errors occurred.

As another example, JESD204C defines an FEC encoder (e.g., FIG. 79 of JESD204C) and a corresponding FEC decoder (e.g., FIG. 81 of JESD204C of JESD204C). The FEC encoder has the same topology as a CRC calculator, where data entry points and feedback points are identical. The FEC decoder has the same feedback points as the encoder but different data entry points. In a first decoding phase, both data entry points and feedback entry points are active while incoming data is processed to calculate a checksum. A non-zero checksum indicates one or more bit errors. In a second decoding phase, the feedback entry points are deactivated while an incoming checksum is processed in order to locate and correct the bit errors.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

In this regard, various embodiments of LFSRs described herein may be implemented with various types of hardware and/or software and allow for significant improvements in, for example, performance and space utilization. By way of non-limiting examples, LFSRs/LFSR architectures described herein may be implemented using ASICs, system on chips, general logic circuits, processors (e.g., configurable processors, digital signal processors), generally any programmable resources of any programmable circuit or device, or any combination thereof. As an example, various embodiments may be used in custom built RTL logic that can be implemented in a general integrated circuit and/or as its own type of dedicated block (e.g., as a standalone resource in a programmable fabric).

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

The invention claimed is:

1. A linear-feedback shift register circuit comprising:
a plurality of state storage elements, wherein each of the plurality of state storage elements is configured to store a respective state signal;
a first plurality of programmable logic stage circuits each configured to:
  selectively receive a respective input signal and a respective set of state signals;
  determine a respective output signal based at least on the respective set of state signals; and
  provide the respective output signal, wherein each programmable logic stage circuit is connected to at least one other programmable logic stage circuit of the first plurality of programmable logic stage circuits, and wherein a first programmable logic stage circuit of the first plurality of programmable logic stage circuits is configured to selectively receive the state signal from each of the plurality of state storage elements;
a plurality of pipeline elements, wherein each of the plurality of pipeline elements is configured to selectively connect at least two programmable logic stage circuits of the first plurality of programmable logic stage circuits; and
a plurality of sets of latency balance elements, wherein a first set of latency balance elements of the plurality of sets is configured to selectively connect an output terminal to a second programmable logic stage circuit of the first plurality of programmable logic stage circuits and selectively buffer the output signal associated with the second programmable logic stage circuit.

2. The linear-feedback shift register circuit of claim 1, wherein a second set of latency balance elements of the plurality of sets is configured to selectively connect a third programmable logic stage circuit of the first plurality of programmable logic stage circuits to an input terminal and selectively buffer the input signal associated with the third programmable logic stage circuit.

3. The linear-feedback shift register circuit of claim 1, wherein a second set of latency balance elements of the plurality of sets is configured to selectively connect the second programmable logic stage circuit to an input terminal and selectively buffer the input signal associated with the second programmable logic stage circuit.

4. The linear-feedback shift register circuit of claim 1, wherein each programmable logic stage circuit of the first plurality of programmable logic stage circuits comprises:
a set of programmable multipliers, wherein each programmable multiplier is configured to selectively receive one state signal of the set of state signals; and
a programmable combiner circuit configured to selectively receive one or more outputs from the set of programmable multipliers and generate, based on the one or more outputs, the output signal.

5. The linear-feedback shift register circuit of claim 1, further comprising a second plurality of programmable logic stage circuits, wherein each programmable logic stage circuit of the second plurality of programmable logic stage circuits is configured to:
selectively receive a respective input signal and a respective set of state signals; and
provide a state signal to an other programmable logic stage circuit of the second plurality of programmable logic stage circuits, wherein a first programmable logic stage circuit of the second plurality of programmable logic stage circuits is configured to selectively receive the state signal from each of the plurality of state storage elements.

6. The linear-feedback shift register circuit of claim 5, wherein each of the plurality of state storage elements is configured to selectively connect the first programmable logic stage circuit of the second plurality of programmable logic stage circuits to a respective one of the second plurality of programmable logic stage circuits.

7. The linear-feedback shift register circuit of claim 5, wherein the first plurality of programmable logic stage circuits and the plurality of pipeline elements form a feed-forward logic circuit, wherein the second plurality of programmable logic stage circuits form a feedback logic circuit, and wherein the state signals stored in the plurality of state storage elements collectively provide a state of the linear-feedback shift register circuit.

8. The linear-feedback shift register circuit of claim 1, wherein each of the plurality of state storage elements is configured to selectively connect the first programmable logic stage circuit to a respective one of the first plurality of programmable logic stage circuits.

9. The linear-feedback shift register circuit of claim 1, further comprising an output conversion circuit configured to receive the output signals from the first plurality of programmable logic stage circuits and generate second output signals.

10. The linear-feedback shift register circuit of claim 9, wherein the output conversion circuit comprises a plurality of programmable conversion logic circuits each configured to generate one of the second output signals, and wherein each programmable conversion logic circuit comprises one or more programmable multipliers and one or more programmable combiners.

11. The linear-feedback shift register circuit of claim 10, further comprising a plurality of output storage elements each configured to store a respective one of the output signals of the first plurality of programmable logic stage circuits, wherein, for each programmable conversion logic circuit, each of the one or more programmable multipliers is selectively connected to one of the plurality of output storage elements or an output terminal of one of the first plurality of programmable logic stage circuits.

12. The linear-feedback shift register circuit of claim 9, wherein the plurality of state storage elements and the first plurality of programmable logic stage circuits collectively provide a Fibonacci linear-feedback shift register architecture, and wherein the second output signals are associated with a Galois linear-feedback shift register architecture.

13. A programmable logic device (PLD) comprising:
an array of configuration memory cells; and
a processing circuit configured to:
receive configuration data associated with the PLD; and
program the array of configuration memory cells with the configuration data to program the linear-feedback shift register circuit of claim 1.

14. A method comprising:
receiving configuration data for a programmable logic device (PLD); and
programming an array of configuration memory cells of the PLD with the configuration data to program the linear-feedback shift register circuit of claim 1.

15. The method of claim 14, wherein the configuration data is provided from a remote system, a memory located within the PLD, and/or a separate memory of a system including the PLD and the separate memory.

16. A linear-feedback shift register circuit comprising:
a plurality of state storage elements, wherein each of the plurality of state storage elements is configured to store a respective state signal;
a feedforward logic circuit comprising a first plurality of programmable logic stage circuits, wherein each programmable logic stage circuit of the first plurality is configured to:
selectively receive a respective input signal and a respective set of state signals;
determine a respective output signal based on the respective set of state signals; and
provide the respective output signal, wherein each programmable logic stage circuit is connected to at least one other programmable logic stage circuit of the first plurality of programmable logic stage circuits; and
a feedback logic circuit comprising a second plurality of programmable logic stage circuits, wherein each programmable logic stage circuit of the second plurality is configured to
selectively receive a respective input signal and a respective set of state signals; and
provide a state signal to an other programmable logic stage circuit of the second plurality of programmable logic stage circuits,
wherein a first programmable logic stage circuit of the first plurality of programmable logic stage circuits and a first programmable logic stage circuit of the second plurality of programmable logic stage circuits are configured to selectively receive the state signal from each of the plurality of state storage elements.

17. The linear-feedback shift register circuit of claim 16, wherein each of the plurality of state storage elements is configured to receive the respective state signal from a respective programmable logic stage circuit of the second plurality of programmable logic stage circuits.

18. The linear-feedback shift register circuit of claim 17, wherein each programmable logic stage circuit of the second plurality of programmable logic stage circuits comprises:
a set of programmable multipliers, wherein each programmable multiplier is configured to selectively receive one state signal of the set of state signals; and
a programmable combiner circuit configured to:
receive one or more outputs from the set of programmable multipliers;
selectively receive the input signal; and
generate, based on the set of state signals, the one or more outputs and the input signal, the state signal.

19. The linear-feedback shift register circuit of claim 16, wherein the feedforward logic circuit further comprises a plurality of pipeline stages, wherein each pipeline stage comprises a respective plurality of pipeline elements, wherein, for each pipeline stage, each of the respective plurality of pipeline elements is configured to selectively connect at least two programmable logic stage circuits of the first plurality of programmable logic stage circuits.

20. The linear-feedback shift register circuit of claim 19, wherein the feedforward logic circuit further comprises a plurality of sets of latency balance elements, wherein a first set of latency balance elements of the plurality of sets is configured to selectively connect an input terminal to a second programmable logic stage circuit of the first plurality of programmable logic stage circuits and selectively store the input signal associated with the second programmable logic stage circuit, and wherein a second set of latency balance elements of the plurality of sets is configured to selectively connect a third programmable logic stage circuit of the first plurality of programmable logic stage circuits to an output terminal and selectively store the output signal associated with the third programmable logic stage circuit.

21. The linear-feedback shift register circuit of claim 20, wherein the feedforward logic circuit further comprises a plurality of sets of latency balance elements, wherein a first set of latency balance elements of the plurality of sets is configured to selectively connect an input terminal to a second programmable logic stage circuit of the first plurality of programmable logic stage circuits and selectively store the input signal associated with the second programmable logic stage circuit, wherein a second set of latency balance elements of the plurality of sets is configured to selectively connect the second programmable logic stage circuit to an output terminal and selectively store the output signal associated with the second programmable logic stage circuit, wherein a number of pipeline stages in the plurality of pipeline stages is the same as a sum of a number of latency balance elements in the first set and a number of latency balance elements in the second set.

22. The linear-feedback shift register circuit of claim 16, further comprising an output conversion circuit configured to receive the output signals from the first plurality of programmable logic stage circuits and generate second output signals.

23. The linear-feedback shift register circuit of claim 22, wherein the output conversion circuit comprises a plurality of programmable conversion logic circuits each configured to generate one of the second output signals, and wherein each programmable conversion logic circuit comprises one or more programmable multipliers and one or more programmable combiners.

24. A programmable logic device (PLD) comprising:
an array of configuration memory cells; and
a processing circuit configured to:
receive configuration data associated with the PLD; and
program the array of configuration memory cells with the configuration data to program the linear-feedback shift register circuit of claim 16.

25. A method comprising:
receiving configuration data for a programmable logic device (PLD); and programming an array of configuration memory cells of the PLD with the configuration data to program the linear-feedback shift register of claim 16.

26. The method of claim 25, wherein the configuration data is provided from a remote system, a memory located within the PLD, and/or a separate memory of a system including the PLD and the separate memory.

\* \* \* \* \*